United States Patent [19]

Arrathoon

[11] Patent Number: 4,979,138
[45] Date of Patent: Dec. 18, 1990

[54] HIGH FAN FACTOR MODIFIED CROSSBAR ARCHITECTURE AND METHOD FOR OPTICAL DIGITAL COMPUTING

[76] Inventor: Raymond Arrathoon, 1409 Chestnut La., Rochester Hills, Mich. 48063

[21] Appl. No.: 395,734

[22] Filed: Aug. 18, 1989

Related U.S. Application Data

[63] Continuation-in-part of Ser. No. 231,718, Aug. 12, 1988, which is a continuation-in-part of Ser. No. 912,353, Sep. 26, 1986, Pat. No. 4,821,222.

[51] Int. Cl.$^5$ .............................................. G06F 7/56
[52] U.S. Cl. ................................................. 364/713
[58] Field of Search ...................... 364/713, 822, 845; 350/96.11, 96.12, 96.13

[56] References Cited

U.S. PATENT DOCUMENTS

| | | | |
|---|---|---|---|
| 3,680,080 | 7/1972 | Maure | 364/713 X |
| 4,569,033 | 2/1986 | Collins et al. | 364/845 |
| 4,607,344 | 8/1986 | Athale et al. | 364/845 X |
| 4,620,293 | 10/1986 | Schlunt et al. | 364/845 |

OTHER PUBLICATIONS

Bigbie et al., "Optical Programmed Logic Array", IBM Tech. Disclosure Bull., vol. 20, No. 8, Jan. 1978, pp. 2960–2961.

*Primary Examiner*—Gary V. Harkcom
*Assistant Examiner*—Tan V. Mai
*Attorney, Agent, or Firm*—Harness, Dickey & Pierce

[57] ABSTRACT

A cross connection apparatus and method for mixing and merging multiple arrays of high optical fan-out factors and multiple arrays of high optical fan-in factors with electronic fan-in and fan-out factors contained within a fiber coupled cross connection array. The cross connection array includes embedded combinational and/or sequential logic devices and an array of optical detectors for receiving optical input signals and an array of output emitters for transmitting optical output signals. The apparatus enables any digital logic scheme requiring combinational and/or sequential logic to be effected in a hybrid optical/electronic manner. This architecture allows a wide variety of combinational and/or sequential logic functions for digital computation and other processes to be carried out at very high rates of speed with increased efficiency.

32 Claims, 12 Drawing Sheets

| | | | M × Log₂N Control Bits — 12 | | | | | N = 4 Data Bits — 13 | | | | M = 4 Output Functions — 14 | | | | |
|---|---|---|---|---|---|---|---|---|---|---|---|---|---|---|---|---|
| $C_1$ | $C_2$ | $C_3$ | $C_4$ | $C_5$ | $C_6$ | $C_7$ | $C_8$ | $X_1$ | $X_2$ | $X_3$ | $X_4$ | $Y_1$ | $Y_2$ | $Y_3$ | $Y_4$ | |
| – | – | – | – | – | – | 0 | 0 | 1 | – | – | – | 1 | 0 | 0 | 0 | ⎫ |
| – | – | – | – | – | – | 0 | 1 | – | 1 | – | – | 1 | 0 | 0 | 0 | ⎬ N=4 Product Terms |
| – | – | – | – | – | – | 1 | 0 | – | – | 1 | – | 1 | 0 | 0 | 0 | |
| – | – | – | – | – | – | 1 | 1 | – | – | – | 1 | 1 | 0 | 0 | 0 | ⎭ |
| – | – | – | – | 0 | 0 | – | – | 1 | – | – | – | 0 | 1 | 0 | 0 | ⎫ |
| – | – | – | – | 0 | 1 | – | – | – | 1 | – | – | 0 | 1 | 0 | 0 | ⎬ N=4 Product Terms |
| – | – | – | – | 1 | 0 | – | – | – | – | 1 | – | 0 | 1 | 0 | 0 | |
| – | – | – | – | 1 | 1 | – | – | – | – | – | 1 | 0 | 1 | 0 | 0 | ⎭ |
| – | – | 0 | 0 | – | – | – | – | 1 | – | – | – | 0 | 0 | 1 | 0 | ⎫ |
| – | – | 0 | 1 | – | – | – | – | – | 1 | – | – | 0 | 0 | 1 | 0 | ⎬ N=4 Product Terms |
| – | – | 1 | 0 | – | – | – | – | – | – | 1 | – | 0 | 0 | 1 | 0 | |
| – | – | 1 | 1 | – | – | – | – | – | – | – | 1 | 0 | 0 | 1 | 0 | ⎭ |
| 0 | 0 | – | – | – | – | – | – | 1 | – | – | – | 0 | 0 | 0 | 1 | ⎫ |
| 0 | 1 | – | – | – | – | – | – | – | 1 | – | – | 0 | 0 | 0 | 1 | ⎬ N=4 Product Terms |
| 1 | 0 | – | – | – | – | – | – | – | – | 1 | – | 0 | 0 | 0 | 1 | |
| 1 | 1 | – | – | – | – | – | – | – | – | – | 1 | 0 | 0 | 0 | 1 | ⎭ |

FIG. 1.

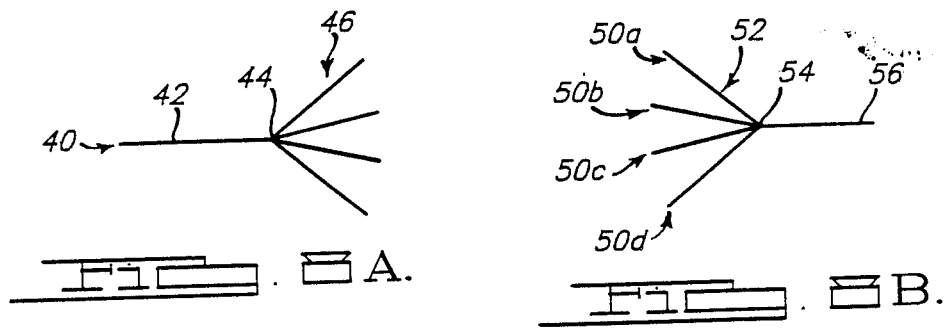
FIG. 8A.
FIG. 8B.
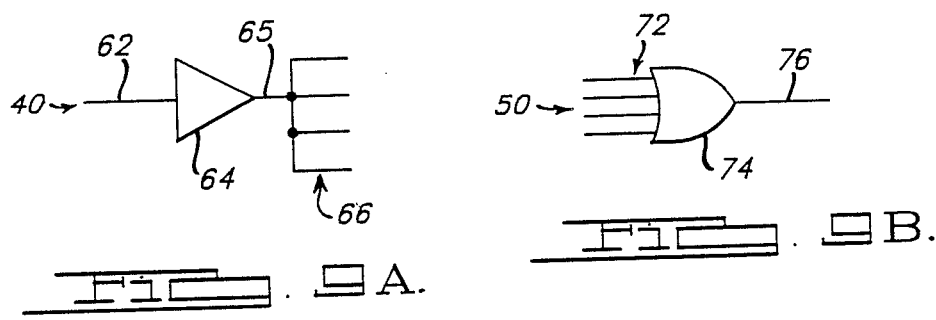
FIG. 9A.
FIG. 9B.
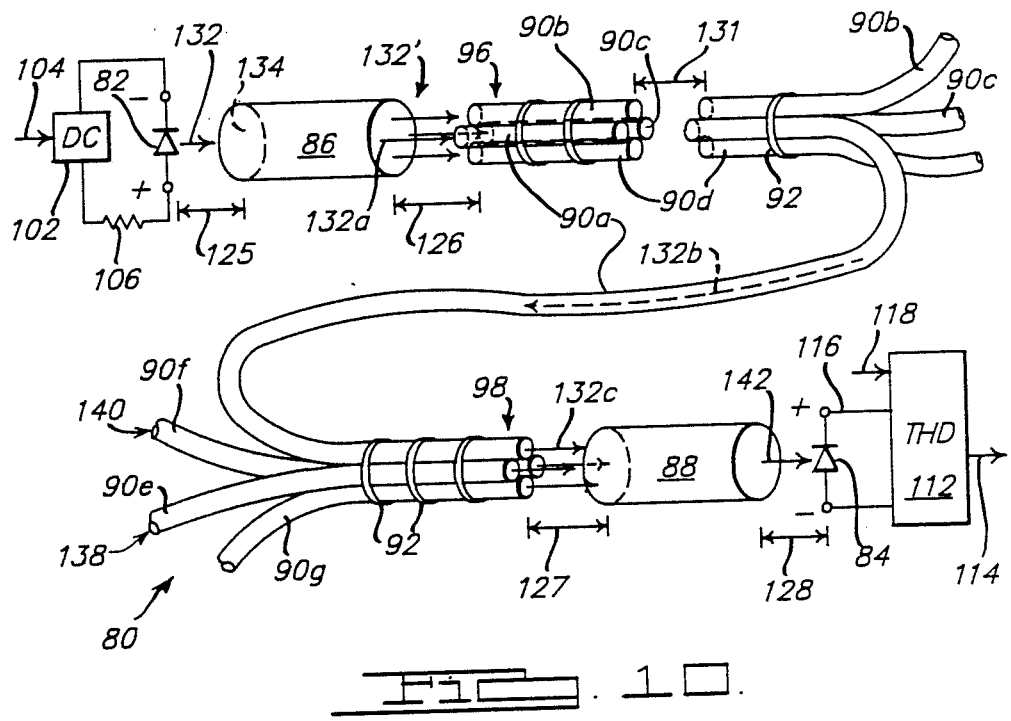
FIG. 10.

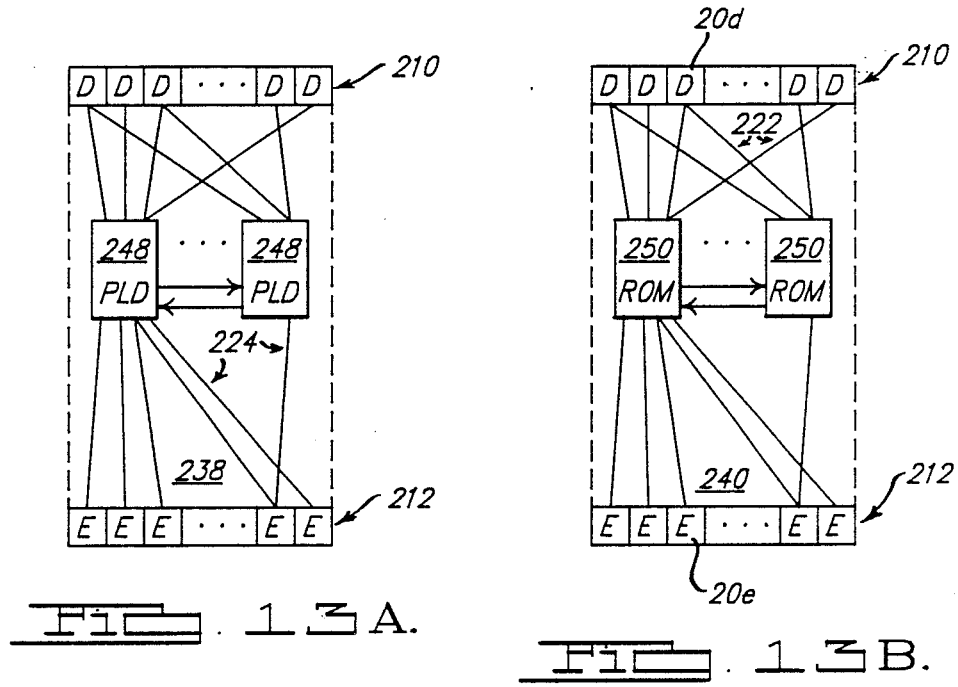
FIG. 13A.
FIG. 13B.
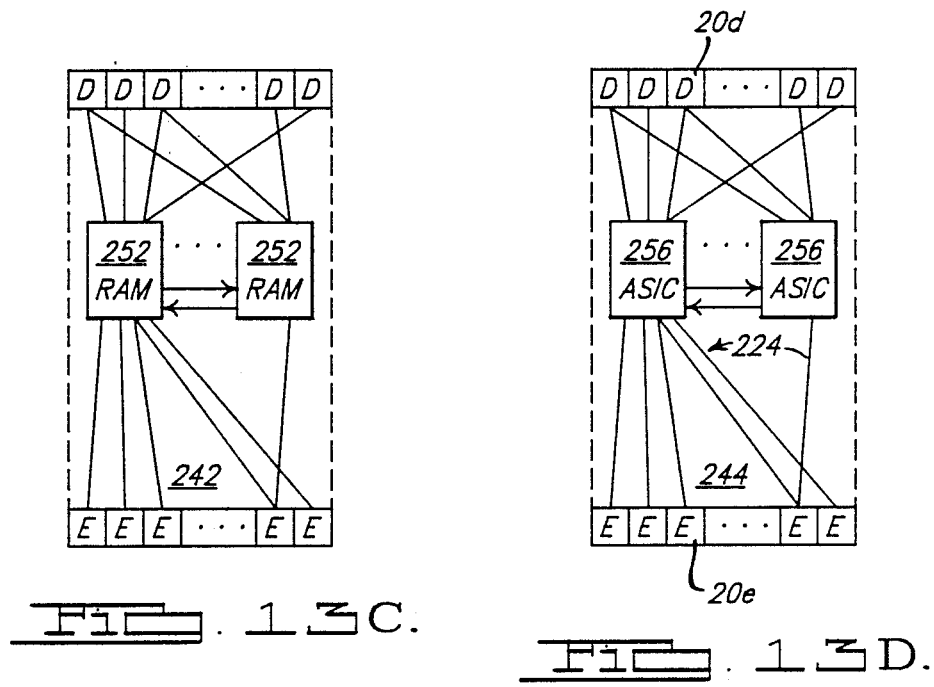
FIG. 13C.
FIG. 13D.

ns that enable the crossbar switch to operate synchronously. In the background portion of application Ser. No. 231,718, there is described a series of references which are generally relevant to the inventions described therein.

The architecture and methods of the present invention represent an evolution of the designs presented and discussed in my application Ser. No. 231,718, particularly the design shown in FIG. 2 therein. The architectures and methods are not restricted to programmable logic devices which implement a restricted group of truth tables. Instead, the implementations of the present invention are capable of effecting any combination of sequential and combinational logic. Thus, it should be appreciated that the present invention represents a generalization of the embedded logic in the cross connection array shown in FIG. 2 of application Ser. No. 231,718.

For further background material on the generalization of crossbar switch-based architectures, reference may be had to four additional references. The first such reference is R. Arrathoon, "Logic Based Spatial Light Modulators," Proceedings of the Society of Photo-Optical Instrumentation Engineers, Vol. 881, pp. 230 (Jan. 1988). This paper suggests that it may be possible to extend basic crossbar switch architectures to achieve a more general logic function, but does not describe methods or structures for implementing such generalized systems.

The second reference is by T. Wang, M. Arshad, and R. Arrathoon, "Optically Controlled Fiber Optic Logic Arrays," Proceedings of the Society of Photo-Optical Instrumentation Engineers, Vol. 977, p. 12 (San Diego, Aug. 1988). This paper was delivered on 18 August 1988 after the filing of application Ser. No. 231,718 and discusses my proposed use of the cross connection architecture with embedded logic for applications that are not solely restricted to the implementation of a simple crossbar switch. The paper includes one figure showing that an additional set of input and control bits may be used to increase the flexibility of the cross connection architecture.

The third reference is by R. Arrathoon, "High Fan Factor Architectures for Optical Parallel Processing," Proceedings of the Third Annual IEEE Parallel Processing Symposium (Fullerton, CA, March 1988). This paper provides further information pertaining to the use of the cross connection architecture, embedded logic, and additional set of input and control bits. The design is more fully shown and described in my application Ser. No. 231,718.

A fourth reference which provides a treatment of this general subject area in a manner that is similar to the aforementioned first reference is R. Arrathoon, OPTICAL COMPUTING, Chapter 9, pp. 247–277 (January 1989; Marcel Dekker, New York Publisher).

The four references just mentioned are hereby incorporated herein by reference, since they provide, for those not fully familiar with digital optical computing principles and performance measures, advantages and operating principles useful to a full appreciation of the apparatuses and methods of the present invention. These four references represent the results of my earlier work, and generally describe systems and methods that are relatively narrow in scope and directed towards a limited class of logic operations. Moreover, these four references fail to disclose in any usable detail the specific embodiments and methods described herein for

HIGH FAN FACTOR MODIFIED CROSSBAR ARCHITECTURE AND METHOD FOR OPTICAL DIGITAL COMPUTING

This application is a continuation-in-part of my copending patent application Ser. No. 07/231,718 filed Aug. 12, 1988 and entitled "Method and Apparatus for Truth Table Based Noncontending Optical Crossbar Switch," which is a continuation-in-part of my U.S. patent application Ser. No. 06/912,353 filed Sep. 26, 1986 (now U.S. Pat. No. 4,821,222) entitled "Method and Apparatus for Programmable Optical Crossbar Logic Array with Decoders," both of which applications are hereby incorporated herein by reference.

BACKGROUND OF THE INVENTION

1. Field of the Invention

This invention relates generally to optical logic-based computing methods and to devices and systems for practicing such methods. More particularly this invention relates to hybrid optical/electronic methods and arrangements for implementing general digital logic, including combinational logic, sequential logic, and/or mixtures thereof. Specifically, this invention relates to novel architectures and methods for implementing any truth table based logic scheme requiring a combination of both fiber optic and electrically connected processing elements or for implementing any algorithm requiring a combination of both fiber optic and electrically connected processing elements, including one processor or multiple processors operating in parallel.

2. Description of the Related Art

In my U.S. Pat. No. 4,821,222, there are described arrangements and methods for the design of a hybrid optical/electronic system that implements logic or computing functions. The system consists of a programmable hybrid optical/electronic INVERT-OR-INVERT-OR logic array that is functionally equivalent to an AND-OR electronic programmable logic array ("PLA") device with decoders. In the hybrid system, electronic decoders send spatially coded binary input information to a row of optical emitters. A programmable optical crossbar is then employed to perform a row-by-row INVERT-OR operation. Light emerging from the crossbar impinges on a column of optical detectors, and individual detector outputs are subsequently inverted electronically. One or more of the resulting signals are then electronically or optically OR'd together. In the background portion of my U.S. Pat. No. 4,821,222 there is a discussion of prior art deemed generally relevant to the inventions described therein.

In my application Ser. No. 231,718, there is described arrangements and methods for the design of a hybrid optical/electronic system that implements a truth table based noncontending N×N or N×M crossbar switch with bit-slice reconfigurability. The hybrid optical/electronic architecture for implementing the switch contains one or more sets of emitters, a cross connection array with imbedded logic, and one or more sets of detectors. Four basic variations of the architecture are described that effect the same basic truth table. The first variation employs direct fiber connections within the cross connection array. The second variation employs embedded programmable logic devices within the cross connection array. The third and fourth variations each employ embedded multiplexers within the cross connection array, with the fourth variation having memory achieving the general purpose functionality of the present invention, as described below.

There has been a growing recognition during the last decade that the limits of electronic digital processing technology are rapidly being approached. In particular, there is a growing awareness in the digital optics computing community that it is essential to mix optics with electronics in order to achieve superior performance in digital computation, particularly for high-speed, high-complexity calculations and for large programs now used or planned for many applications ranging from artificial intelligence, image processing, pattern recognition, to database management, among others. In this regard, there has been a long-standing need for a general purpose optoelectronic architecture which would maximize the advantages achievable with hybrid optoelectronic/digital computing systems. To the best of my knowledge, all previous crossbar systems and related approaches to digital computing failed to merge or arrange electronic components within the cross connection array to maximize the advantages of high optical fan-in and fan-out factors and the global connectivity of the hybrid crossbar architecture illustrated in FIG. 2 of my application Ser. No. 231,718.

The objects of the embodiments of my inventions first described in application Ser. No. 321,718 (and also described here) include the following:

(1) to provide a method and apparatus for a hybrid optical/electronic noncontending NXM crossbar switch that overcomes many of the restrictions of existing crossbar switches in terms of being able to achieve both high data rates and high reconfiguration rates;

(2) to achieve the first object (Object 1) by providing a method and apparatus for implementing a truth table based hybrid optical/electronic noncontending $N \times M$ crossbar switch with bit-slice reconfigurability;

(3) to provide a method and apparatus for a generalized structure that is capable of implementing a truth table based hybrid optical/electronic noncontending $N \times M$ crossbar switch with bit-slice reconfigurability;

(4) to provide a method and apparatus for a truth table based hybrid optical/electronic asynchronous noncontending $N \times M$ crossbar switch that is effected by optoelectronic means through the sequence INVERT-OR-INVERT-OR;

(5) to provide a method and apparatus for a truth table based hybrid optical/electronic asynchronous noncontending $N \times M$ crossbar switch that is effected by a combination of optoelectronic means and programmable logic devices (PLDs);

(6) to provide a method and apparatus for a truth table based hybrid optical/electronic asynchronous noncontending $N \times M$ crossbar switch that is effected by a combination of optoelectronic means and multiplexers;

(7) to provide a method and apparatus for a truth table based hybrid optical/electronic synchronous noncontending $N \times M$ crossbar switch that is effected by a combination of optoelectronic means, multiplexers, and memory elements.

The present invention seeks to add to, generalize and improve upon the embodiments of my invention described in application Ser. No. 231,718. The objects of the present invention may be more specifically described as follows:

(8) to provide a method and apparatus for mixing and merging high optical fan-in and fan-out factors with electronic fan-in and fan-out factors contained within a fiber coupled cross connection array including embedded electronic logic devices in order to implement in a hybrid optical/electronic manner any digital logic scheme requiring combinational and/or sequential logic;

(9) to provide a method and apparatus for implementing any truth table-based logic scheme or, equivalently, any combinational logic based scheme with an array of both fiber optic and electrically connected programmable logic devices (PLDs);

(10) to provide a method and apparatus for implementing any truth table-based logic scheme or, equivalently, any combinational logic based scheme with an array of both fiber optic and electrically connected read only memories (ROMs);

(11) to provide a method and apparatus for implementing any dynamically programmable memory scheme with an array of both fiber optic and electrically connected random access memories (RAMs);

(12) to provide a method and apparatus for implementing any algorithm requiring a combination of both fiber optic and electrically connected processing elements, including one processor or multiple processors operating in parallel;

(13) to provide a method and apparatus for implementing any algorithm and/or truth table requiring a combination of both fiber optic and electrically connected application specific integrated circuits (ASICs) and/or electronic logic elements.

(14) to achieve the Objects 8 through 13 above by utilizing any combination of electronic fan-in and fan-out factors and sequential and/or combinational logic elements embedded within a fiber optically coupled cross connection array in a globally-connected high fan factor architecture.

(15) to achieve the Objects 8 through 14 above by simultaneously processing any or all multiple input arrays of input data bits and/or input control bits and/or input timing bits utilizing any combination of electronic fan-in and fan-out factors and sequential and/or combinational logic elements embedded within a fiber optically coupled generalized cross connection array.

SUMMARY OF THE INVENTION

To achieve Objects 1 through 7 above, there are provided, according to my inventions described both here and in my application Ser. No. 321,718, several methods and apparatuses for implementing a truth table based hybrid optical/electronic noncontending $N \times M$ crossbar switch with bit-slice reconfigurability.

In a first method and apparatus of my invention, the logic for an asynchronous noncontending $N \times M$ crossbar switch with N optically coupled input data lines and M optically coupled output lines may be described in terms of a simple truth table in which the truth table inputs consist of N input data bits and $(\log_2 N) \times M$ input control bits. The truth table itself may be defined in terms of $N \times M$ product terms that are divided into M groups, each consisting of N unity output terms, with each of the groups corresponding to one of the M output lines. When the entire table is implemented with hybrid optical/electronic combinational logic elements said table may be effected in a fully parallel manner to provide asynchronous control and data operation. Alternately, if the table is implemented with both combinational logic and memory elements, the table may be divided into segments, but synchronous control and data operation will be required.

In this first embodiment, a series of semiconductor lasers or light emitting diodes are spatially positioned along a row array. The input optical signal from each emitting element of the row array is fanned-out in a fiber coupled globally connected crossbar arrangement to each column of a generalized fiber-coupled cross connection array. This generalized cross connection array includes fiber-coupled optical input detectors and fiber-coupled optical output emitters. The generalized cross connection array may also include logic operations between the input detector and output emitter assembly. One of the principal advantages of the embedded logic within the generalized cross connection array is the ability to mix and merge electronic fan-out factors, electronic fan-in factors, and electronic logic with the incoming and outgoing optical signals. A second set of optical signals is preferably provided to the generalized cross connection array by a column array of fiber-coupled semiconductor or light emitting diodes. The optical signal from each element of the second input array is fanned-out in an orthogonal manner to the fan-out pattern of the first input array. The outputs from this group of emitters are then fiber-coupled to each row of the generalized cross connection array. The output of the generalized cross connection array itself is fiber-coupled to a column array of optical detectors in a standard optical crossbar geometry wherein each row output of the generalized cross connection array is fanned-in to each element of the detector column array. This embodiment specifically requires that the optical fan-out factor exceed unity along at least one of the input arrays. As will be more fully appreciated from the detailed description below, the entire system thus constitutes a generalized structure that is capable of implementing a truth table based noncontending hybrid optical/electronic $N \times M$ crossbar switch which is bit-slice reconfigurable.

In a second embodiment of my invention, the truth table previously described in this section for an $N \times M$ noncontending optical crossbar switch with bit slice reconfigurability is effected according to the sequence INVERT-OR-INVERT-OR in accordance with the procedure described in my U.S. Pat. No. 4,821,222. The truth table may be effected with the procedures described in this patent application or may be similarly effected with the generalized structure described earlier in this section by requiring that only the first set of orthogonal inputs of the generalized structure be active, by including electrical decoders before the first stage of orthogonal inputs, by including an additional stage of inverting emitters that are directly connected to each element of the column array of the output detectors, and by fanning-in the optical outputs from one or more of these final emitters to a final column array of detectors. The first set of orthogonal inputs, consisting of decoded data and control bits, drive a set of inverting emitters that are fiber-coupled to the generalized cross connection array in a standard crossbar structure. In this approach, the first INVERT in the sequence INVERT-OR-INVERT-OR is effected in parallel by the inverting emitters. Here, the generalized cross connection array consists solely of a direct fiber connection in a standard crossbar geometry. The first OR in the sequence INVERT-OR-INVERT-OR is effected in parallel by detection and thresholding elements in the output detector array. The second INVERT in the sequence INVERT-OR-INVERT-OR is effected by the second set of inverting emitters, while the final OR is effected in the final set of detection and thresholding elements. This mode of operation is asynchronous.

In the third embodiment of my invention, the generalized structure described earlier in this section is employed with both sets of orthogonal inputs in an active mode. The first set of inputs, consisting only of data bits, are fanned-out to the fiber-coupled generalized cross connection network as described earlier. The second set of inputs, consisting only of control bits, are fanned-out to the generalized cross connection network in an orthogonal direction to the first set of inputs. Detection and thresholding elements in the generalized cross connection network are then connected in parallel to an array of programmable logic devices that perform local logic operations within the generalized connection network. This mode of operation is asynchronous. The outputs of the programmable logic devices are connected to the fiber-coupled output of the generalized connection array. The optical output signals are then fanned-in, detected, and thresholded at the output detector array.

In a fourth embodiment of my invention, the generalized structure described earlier is employed with only the first set of orthogonal inputs in an active mode. The first set of inputs, consisting of both data and control bits, are fanned-out to the generalized cross connection network as described earlier. Detection and thresholding elements in the generalized cross connection network are then connected to an array of multiplexers that operate in parallel within the generalized connection network. This mode of operation is asynchronous. The output of each multiplexer is connected to the fiber-coupled output of the generalized connection array. The optical output signals are then directly connected to the output detector array, where they are detected and thresholded.

In the fifth embodiment of my invention, the generalized structure described earlier is employed with only the first set of orthogonal inputs in an active mode. The first set of inputs, consisting of both data and control bits, are fanned-out to the generalized cross connection network as described earlier. Detection and thresholding elements in the generalized cross connection network are then connected to an array of multiplexers that are latched in a sequential manner within the generalized connection network. This mode of operation necessitates synchronous operation. The output of each multiplexer is connected to the fiber-coupled output of the generalized connection array. The optical output signals are then directly connected to the output detector array, where they are detected and thresholded.

In light of the overall object of my further invention, namely Object No. 8, the first embodiment of the earlier invention also may be regarded as providing a method and apparatus for mixing and merging high optical fan-in and fan-out factors with electronic fan-in and fan-out factors contained within a fiber coupled cross connection array that includes embedded combinational and/or sequential logic devices in order to implement in a hybrid optical/electronic manner any digital logic scheme requiring combinational and/or sequential logic. That is to say, the mixture of electronic fan-out factors, electronic fan-in factors, and embedded combinational and/or sequential logic contained within the cross connection array can be applied to a wide variety of combinational and/or sequential logic functions for digital computation or processes. In this approach optical inputs are accepted from either or both orthogonal arrays of input data bits and/or input control bits and/or input timing bits based on fan-out along either or both input axes to a fiber optic coupled generalized cross connection array structure with embedded logic that provides an array of outputs based on fan-in along one axis of the cross connection array structure. This embodiment specifically requires that the optical fan-out factor exceed unity along at least one of the input arrays. The entire hybrid fiber optic/electronic system is then capable of implementing general digital logic, including combinational logic, sequential logic, and mixtures thereof.

In a sixth embodiment detailed in the present application, a method and apparatus is provided for mixing and merging multiple arrays of high optical fan-out factors and multiple arrays of high optical fan-in factors with electronic fan-in and fan-out factors contained within a fiber coupled cross connection array that includes embedded combinational and/or sequential logic devices in order to implement in a hybrid optical/electronic manner any digital logic scheme requiring combinational and/or sequential logic. Under these circumstances, the mixture of electronic fan-out factors, electronic fan-in factors, and embedded combinational and/or sequential logic contained within the cross connection array can be applied to a wide variety of combinational and/or sequential logic functions for digital computation. In this approach optical inputs are accepted from any or all multiple orthogonal input arrays of input data bits and/or input control bits and/or input timing bits based on fan-out along either or both input axes to a fiber optic coupled generalized cross connection array structure with embedded logic that provides any or all multiple arrays of outputs based on fan-in along one axis of the cross connection array structure. This embodiment also specifically requires that the optical fan-out factor exceed unity along at least one of the input arrays. The entire hybrid fiber optic/electronic system is then capable of implementing general digital logic, including combinational logic, sequential logic, and mixtures thereof.

In the seventh and eighth embodiments detailed in the present continuation, a method and apparatus is provided for mixing and merging multiple arrays of high optical fan-out factors and multiple arrays of high optical fan-in factors with electronic fan-in and fan-out factors contained within a fiber coupled cross connection array that includes embedded combinational and/or sequential logic devices in order to implement in a hybrid optical/electronic manner any digital logic scheme requiring combinational and/or sequential logic. Under these circumstances, the mixture of electronic fan-out factors, electronic fan-in factors, and embedded combinational and/or sequential logic contained within the cross connection array can be applied to a wide variety of combinational and/or sequential logic functions for digital computation. In this approach optical inputs are accepted from any or all multiple orthogonal input arrays of input data bits and/or input control bits and/or input timing bits based on fan-out along either or both input axes to a fiber optic coupled generalized cross connection array structure with embedded logic that provides any or all multiple orthogonal arrays of outputs based on fan-in along either or both output axes of the cross connection array structure. These embodiments also specifically require that the optical fan-out factor exceed unity along at least one of the input arrays. The entire hybrid fiber optic/electronic system is then capable of implementing general digital logic, including combinational logic, sequential logic, and mixtures thereof. Moreover, in these two embodiments, the fiber optic interconnect sets between the input arrays, the output arrays and cross connection arrays may contain less than a global set of interconnects. Further, the number of detectors may be less than or equal to the number of interconnects, and can be reduced to the minimum number required for a particular application.

In light of the overall object (Object No. 8) of the present invention, the first, sixth, seventh and eighth embodiments presented herein quite specifically may be regarded as providing a method and apparatus for implementing any truth table-based logic scheme or, equivalently, any combinational logic based scheme with an array of both fiber optic and electrically connected programmable logic devices.

Alternatively, the first and sixth through eighth embodiments also may be regarded as providing a method and apparatus for implementing any programmable memory scheme with an array of both fiber optic and electrically connected read only memories (ROMs). As a second alternative, these embodiments also may be regarded as providing a method and apparatus for implementing any dynamically programmable memory scheme with an array of both fiber optic and electrically connected random access memories (RAMs).

Further, the first, and sixth through eighth embodiments also may be regarded as providing a method and apparatus for implementing any algorithm requiring a combination of both fiber optic and electrically connected processing elements, including one processor or multiple processors operating in parallel.

Finally, the first, and sixth through eighth embodiments also may be regarded as providing a method and apparatus for implementing any algorithm requiring a combination of both fiber optic and electrically connected application specific integrated circuits (ASICs) and/or other electronic logic elements.

These and other aspects and advantages of the present invention will be more fully understood by reference to the detailed description which follows, taken in conjunction with the various figures and appended claims.

BRIEF DESCRIPTION OF THE DRAWINGS

The drawings form an integral part of the description of the preferred embodiments and are to be read in conjunction therewith. Like reference numerals designate identical components in the different Figures, where:

FIG. 1 depicts a binary truth table for a noncontending 4×4 crossbar switch with bit-slice reconfigurability illustrating the procedure for developing a truth table defining an NxM crossbar switch with bit-slice reconfigurability that may be employed in practicing this invention;

FIGS. 8A and 8B graphically depict the concepts of fan-out and fan-in, respectively;

FIGS. 9A and 9B depict possible electrical circuit structures for accomplishing fan-out and fan-in;

FIG. 10 depicts in simplified fragmentary, exploded perspective form an optoelectronic structure for accomplishing fan-out and fan-in using optical fibers and diodes;

FIG. 13 depicts four single printed circuit boards usable in a FIG. 2 cross connection array, with the boards of FIGS. 13A, 13B, 13C and 13D respectively using pluralities of PLDs, ROMs, RAMs and ASICs;

FIGS. 17 and 18 schematically each depict a crossbar switch apparatus of the present invention having seven dimensions, with FIG. 17 apparatus effecting fan-in as shown in FIG. 10, and the FIG. 18 apparatus effecting fan-in as shown in FIG. 17.

DETAILED DESCRIPTION OF THE PREFERRED EMBODIMENTS

Figure 2A:
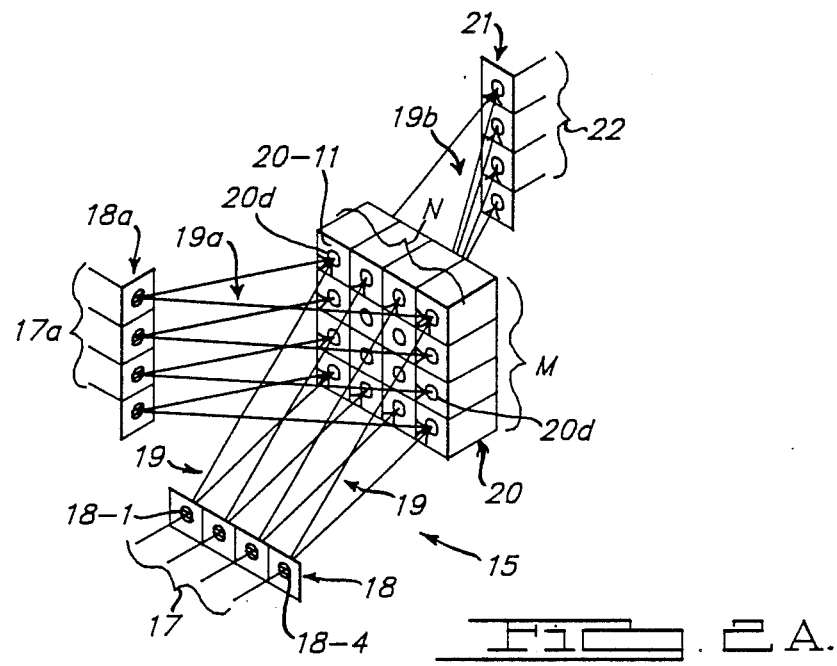
FIGS. 2A and 2B depict front and back perspective views, respectively, of a generalized architecture that may be employed in implementing truth tables of the form shown in FIG. 1, or in implementing various general digital logic functions.

Prior to discussing various preferred embodiments of the present invention, it is useful to discuss the truth table 11 shown in FIG. 1, which provides one possible mathematical or logical foundation for the methods and apparatuses described thereafter and illustrated in the subsequent FIGS. 2 through 7.

In the FIG. 1 table, input control variables C1, C2, C3, C4, C5, C6, C7 and C8, indicated generally by the reference numeral 12, and input data variables X1, X2, X3 and X4, indicated generally by the numeral 13, are represented in a truth table format that defines four output functions Y1, Y2, Y3, Y4 indicated generally by the numeral 14. This truth table defines the logic for a fully parallel noncontending 4×4 crossbar switch in which any of the data inputs may be connected to any or all of the outputs. More generally, the table indicates that with N input data bits and $(\log_2 N) \times M$ input control bits, $N \times M$ product terms are generated that may be divided into M groups, each consisting of N unity output terms, with each group corresponding to one of the M output lines. When the entire table is implemented with hybrid optical/electronic combinational logic elements, the table may be effected in a fully parallel manner to provide asynchronous control and data operation. Alternately, if the table is implemented with both combinational logic and memory elements, the table may be divided into segments, but synchronous control and data operation will be required.

Mathematically, the FIG. 1 table is equivalent to a noncontending 4×4 crossbar switch in which the control variables C1, C2, C3, C4, C5, C6, C7 and C8 determine the switch connection pattern. By resetting the switch connection pattern after one or more bit cycles of data bits X1, X2, X3 and X4 are routed through the switch, the switch may be operated in a manner that is bit-slice reconfigurable. This approach is potentially capable of realizing reconfiguration rates that are comparable to input data rates.

Figure 2B:
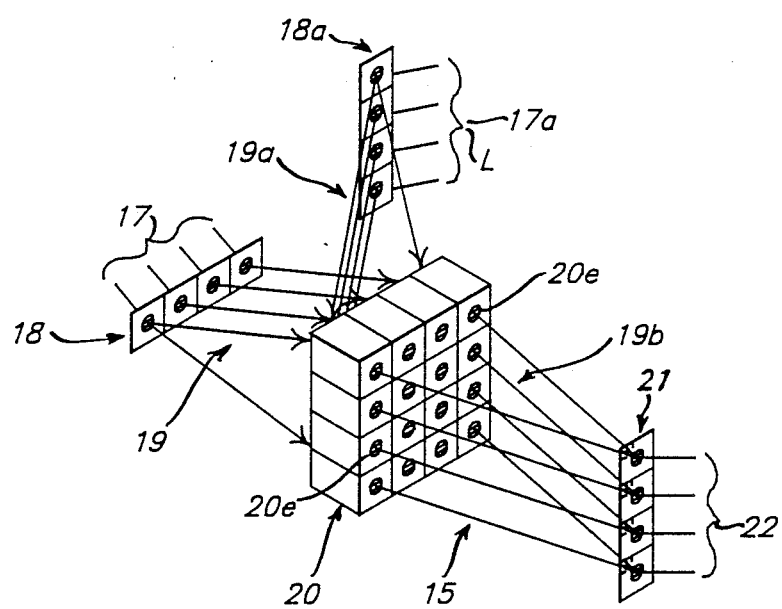

FIGS. 2A and 2B show front and back views, respectively, of a generalized architecture or system 15 that may be employed in implementing truth tables of the form shown in FIG. 1. One set of electrical inputs indicated generally by the numeral 17 drives a set of optical emitters consisting of a linear array of lasers or light emitting diodes that are indicated generally by the numeral 18. Individual emitters are represented by striped circles 18-1 to 18-4. The fiber coupled outputs from these emitters 18 are fanned-out as optical fiber interconnects indicated generally by the numeral 19 to a cross connection array 20 that contains fiber coupled detectors, internal logic, and fiber coupled emitters. As is clearly shown, array 20 is constructed to receive optical inputs via an array of optical detectors 20d indicated by hollow circles and arranged in a two-dimensional or "row and column" format. Each optical input or combination of inputs selectively produces an optical output via an array of optical emitters 20e consisting of lasers or light emitting diodes in accordance with the internal logic of the array 20 associated with such input. As those in the art should readily appreciate, one of the principal advantages of the embedded logic within the generalized cross connection array 20 is the ability to mix and merge electronic fan-out factors, electronic fan-in factors and electronic logic with the incoming and outgoing optical signals.

A second set of electrical inputs indicated by the alphanumeric symbol 17a drives a second set of optical emitters consisting of a linear array of lasers or light emitting diodes that are indicated generally by the alphanumeric symbol 18a. The fiber coupled outputs from these emitters 18a are fanned-out as optical fiber interconnects indicated generally by the alphanumeric symbol 19a to the generalized cross connection array 20 in a manner that may be arranged as shown orthogonal to the first set of optical fiber interconnects 19. This embodiment specifically requires that the optical fan-out factor exceed unity along at least one of the linear emitter input arrays 18 or 18a. The outputs of the generalized cross connection array 20 are fanned-in via optical fiber interconnects indicated generally by the alphanumeric symbol 19b to a linear array of optical thresholding detectors shown as hollow circles and indicated generally by the numeral 21. The detectors provide electrical outputs 22. The entire system 15 constitutes a generalized architecture that is capable of implementing a truth table based noncontending hybrid optical/electronic N×M crossbar switch that is bit-slice reconfigurable. Those in the art will readily appreciate that the various parts 17 through 21 of the system 15 may be constructed using any conventional or suitable components, as will be further explained below.

Figure 3:
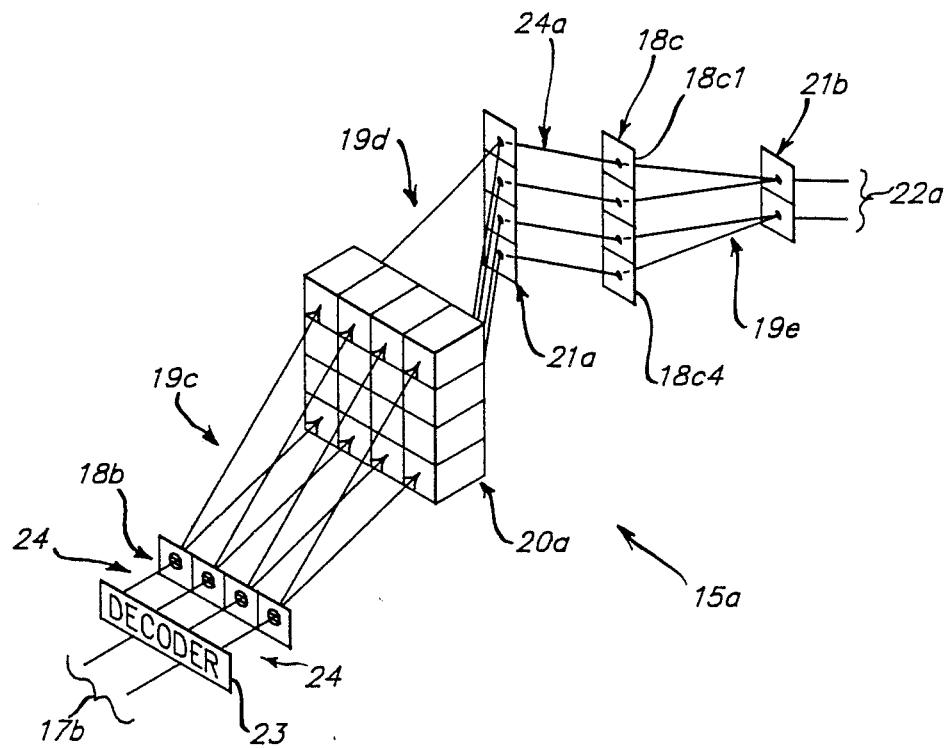
FIG. 3 depicts an extension of the generalized architecture of FIG. 2 that permits all of the logical OR operations in the sequence INVERT-OR-INVERT-OR to be effected optoelectronically.

FIG. 3 shows a second system 15a which is a variation and extension of the generalized architecture illustrated in FIG. 2. The purpose of this extension is to implement the logical sequence INVERT-OR-INVERT-OR in a manner that eliminates the need to include internal logic within the generalized cross connection array 20 depicted in FIG. 2. Referring to FIG. 3, electrical inputs indicated generally by the symbol 17b enter one or more electrical decoders indicated generally by the numeral 23. The decoder electrical output lines are indicated generally by the numeral 24 and are connected to a fiber coupled inverting emitter array 18b which accepts the electrical inputs on lines 24, individually inverts them, and generates optical signals respectively corresponding to the inverted signals. The first INVERT in the logical sequence INVERT-OR-INVERT-OR is effected by the inverting emitters 18b.

The fiber coupled outputs from emitters 18b are fanned-out as optical fiber interconnects 19c to a generalized cross connection array 20a. The sole function of the generalized cross connection array 20a in system 15a is to provide a direct fiber connection between input optical fiber interconnects 19c and output optical fiber interconnects indicated generally by the alphanumeric symbol 19d. The optical fiber interconnects 19d are fanned-in to a fiber coupled thresholding detector array 21a. The detector array 21a effects the first OR in the logical sequence INVERT-OR-INVERT-OR. The electrical output lines 24a of detector array 21a are connected to an array 18c of inverting emitters 18c1 through 18c4 which each receive an electrical input from a respective one of the lines 24a, inverts this electrical signal and then generates and emits a corresponding optical input signal. The optical outputs from inverting emitters 18c are fanned-in via optical fiber interconnects 19e to an array 21b of optical thresholding detectors. The detector array 21b effects the final OR operation in the sequence INVERT-OR-INVERT-OR and provides electrical outputs generally indicated by symbol 22a. This architecture effects a generalized INVERT-OR-INVERT-OR sequence and is capable of implementing a truth table based noncontending hybrid optical/electronic N×M crossbar switch that is bit-slice reconfigurable.

Figure 4:
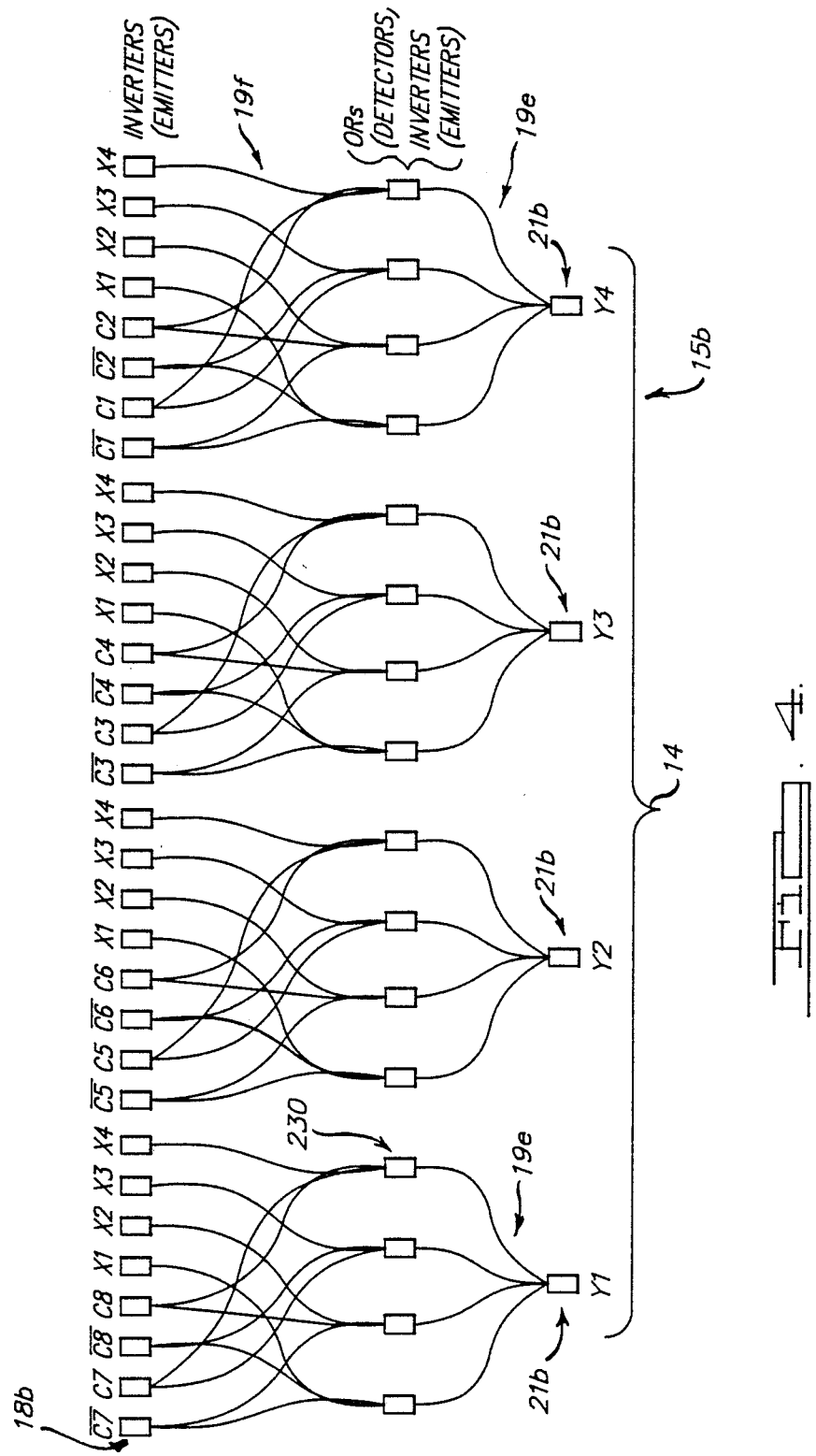
FIG. 4 depicts a specific example of an asynchronous 4×4 crossbar switch with bit-slice reconfigurability that is effected in accordance with the architecture of FIG. 3.

The INVERT-OR-INVERT-OR architecture of FIG. 3 is specifically applicable to the truth table of FIG. 1 to effect a 4×4 noncontending crossbar switch 15b with bit-slice reconfigurability as depicted in FIG. 4. For purposes of clarity, some of the details of FIG. 3 are omitted from the schematic illustration of FIG. 4. In FIG. 4, the input control variables are indicated by the reference symbols C1, C2, C3, C4, C5, C6, C7 and C8, and their complements are respectively indicated by the same symbols with conventional bars thereover. Input data variables are indicated by the reference symbols X1, X2, X3 and X4. Inverting emitters 18b are directly fiber coupled as indicated generally by the symbol 19f to detector/emitter array 230. Fiber interconnects 19f may be thought of as a direct connection of fiber interconnects 19c and 19d together, without the cross connection array 20a being disposed therebetween. The detector/emitter array 230 may be thought of as a replacement for detectors 21a, electrical interconnects 24a and emitters 18e shown in FIG. 2. The outputs of the detector/emitter array 23 are fanned-in via optical fiber interconnects 19e to detector array 21b. The overall operation of the crossbar switch 15c having the topology shown in FIG. 4 is to implement the functions Y1, Y2, Y3 and Y4 as indicated in truth table 11 shown in FIG. 1. This mode of operation is asynchronous.

Figure 5:
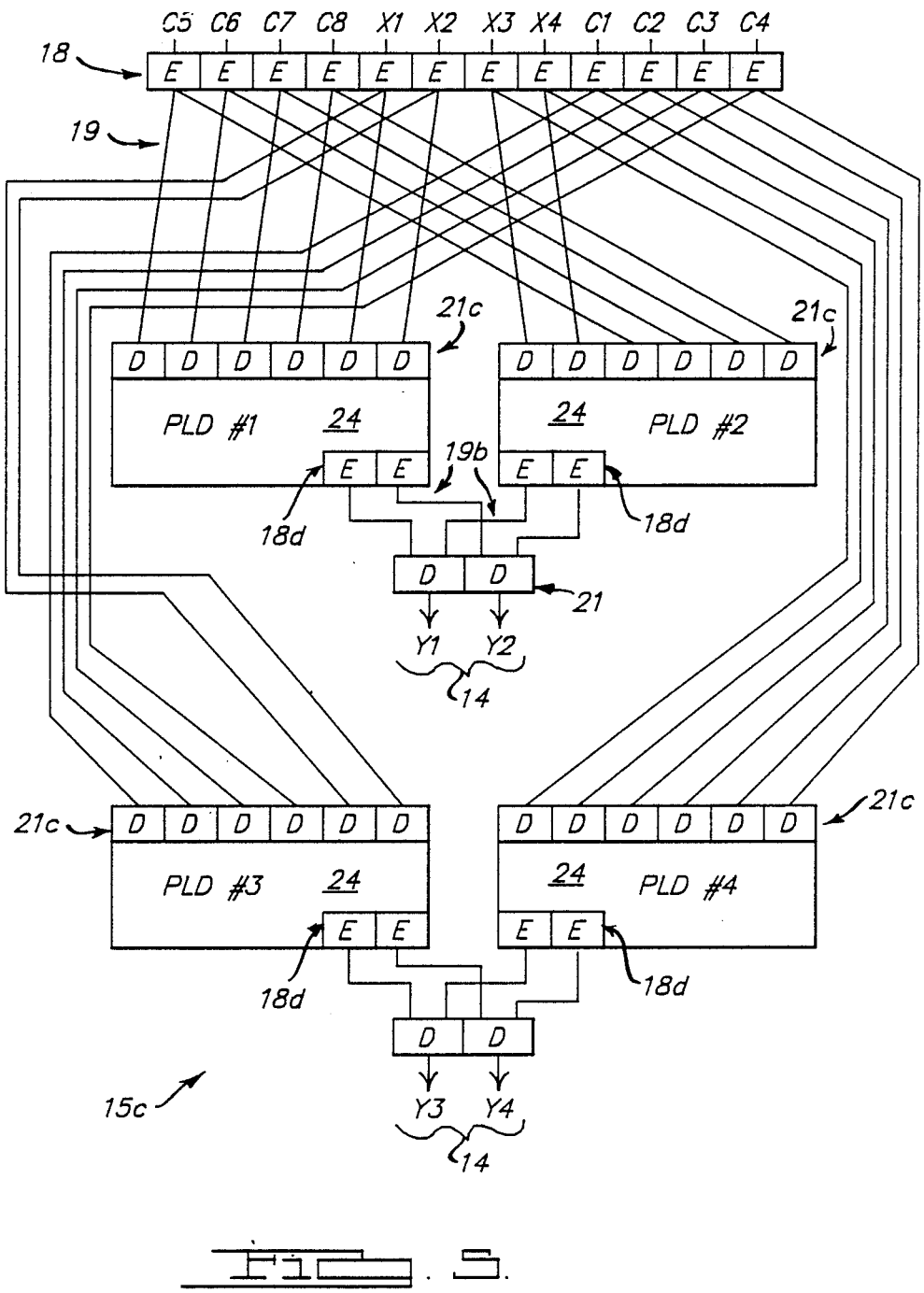
FIG. 5 depicts a specific example of a programmable logic device based asynchronous 4×4 crossbar switch with bit-slice reconfigurability that is effected in accordance with the architecture of FIG. 2.

The generalized architecture of FIG. 2 may also specifically be applied to the truth table 11 of FIG. 1 to effect a programmable logic based 4×4 noncontending crossbar switch 15c with bit-slice reconfigurability as depicted in FIG. 5. For purposes of clarity, some of the details of FIG. 2 are omitted from the schematic illustration of FIG. 5. Again, the input control variables are indicated by reference symbols C1, C2, C3, C4, C5, C6, C7 and C8, and input data variables are indicated by the reference symbols X1, X2, X3 and X4. Emitters 18 are fanned-out with optical fiber interconnects 19 to a group of detectors indicated generally by the alphanumeric symbol 21c. The detectors 21c are coupled to a first set of programmable logic devices generally indicated by the numeral 24. The outputs of the programmable logic devices 24 are respectively connected to dedicated sets of emitters 18d which are then fanned-in with optical fiber interconnects 19b to detector array 21. The outputs of the detector arrays 21 are four output functions Y1, Y2, Y3 and Y4 as indicated. This mode of operation is asynchronous. This programmable logic device based approach shown in FIG. 5 mixes and merges electronic fan-out factors and electronic fan-in factors with incoming and outgoing optical signals.

Figure 6:
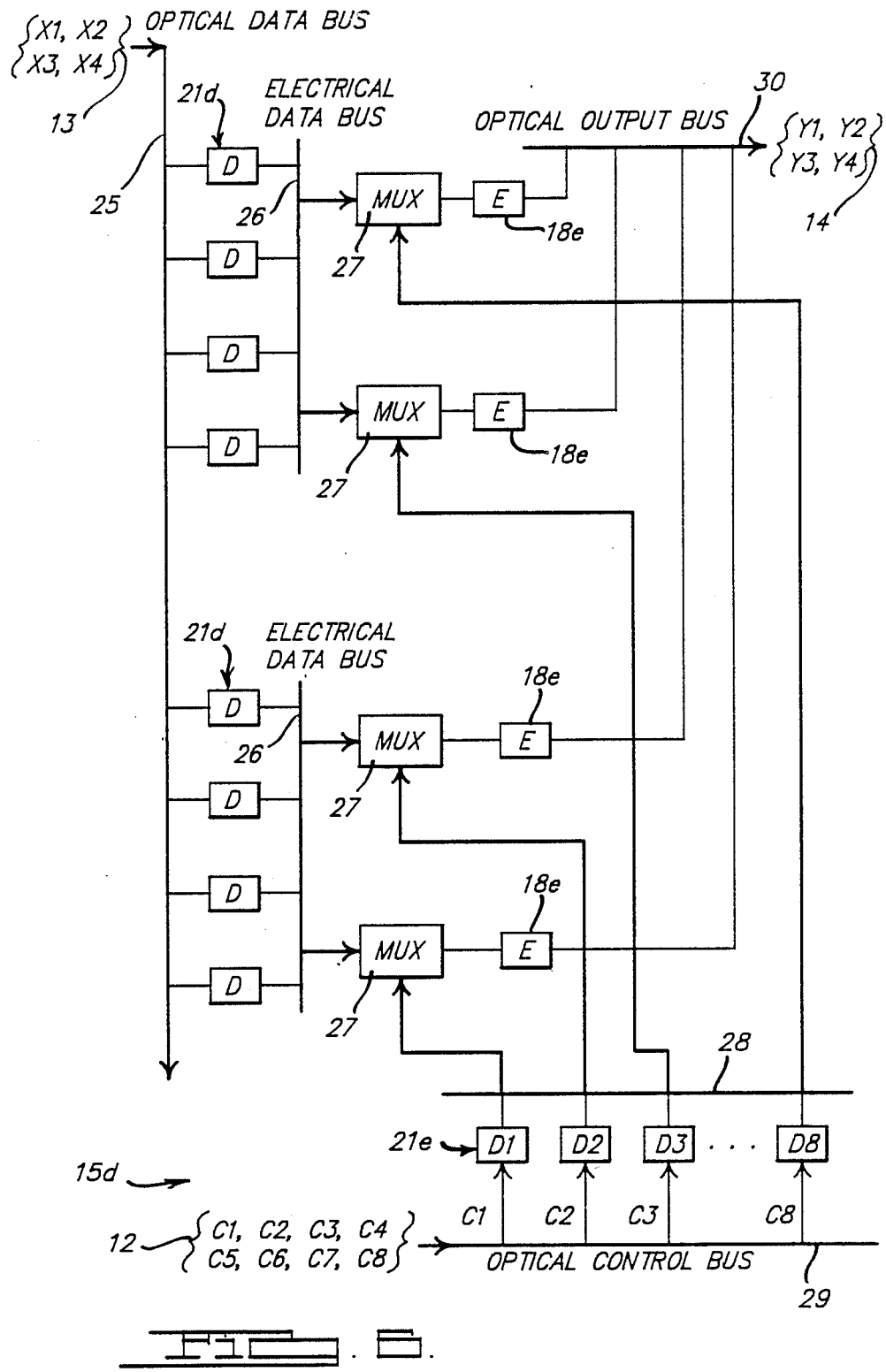
FIG. 6 depicts a specific example of a multiplexer based asynchronous 4×4 crossbar switch with bit-slice reconfigurability that is effected in accordance with the architecture of FIG. 2.

As shown in FIG. 6, the generalized architecture of FIG. 2 may be specifically applied to the truth table of FIG. 1 to effect in yet another way an asynchronous multiplexer based 4×4 noncontending crossbar switch with bit-slice reconfigurability. This additional embodiment is illustrated in FIG. 6 as crossbar switch 15d. For purposes of clarity, some of the details of the FIG. 2 structure are omitted from the schematic illustration of the switch 15d in FIG. 6. Once again, input control variables are indicated by reference symbols C1, C2, C3, C4, C5, C6, C7 and C8 and input data variables are indicated by symbols X1, X2, X3 and X4. Optical input signals X1 through X4 from a conventional or suitable optical data bus 25 are fanned-out to two sets of detectors 21d. The outputs of the two detectors 21d are respectively connected to one of two electrical data busses 26 as shown that separately fan-out the electrical signals to each of two multiplexers 27, which are of conventional construction. Control inputs to multiplexer 27 are supplied from a separate electrical control bus indicated by the numeral 28. The input to this electrical control bus 28 is supplied from a set of eight detectors 21e that are in turn supplied by optical input signals originating from an optical control bus 29. The outputs of the multiplexers 27 are individually connected to optical emitters 18e. The emitters 18e then drive an optical output bus 30 to provide the desired four output functions Y1, Y2, Y3 and Y4. This mode of operation is fully parallel and is asynchronous. The multiplexers 27 in effect provide all of the required fan-in factors and eliminate the need for optical fan-in. The fan-out factor provided by the electrical data bus also reduces the optical fan-out requirements that would otherwise be necessary. Mixing and merging electronic fan-out factors and electronic fan-in factors with incoming and outgoing optical signals essentially reduces the total number of optoelectronic emitters and detectors, thereby lowering the overall cost of the crossbar switch 15d substantially.

Figure 7:
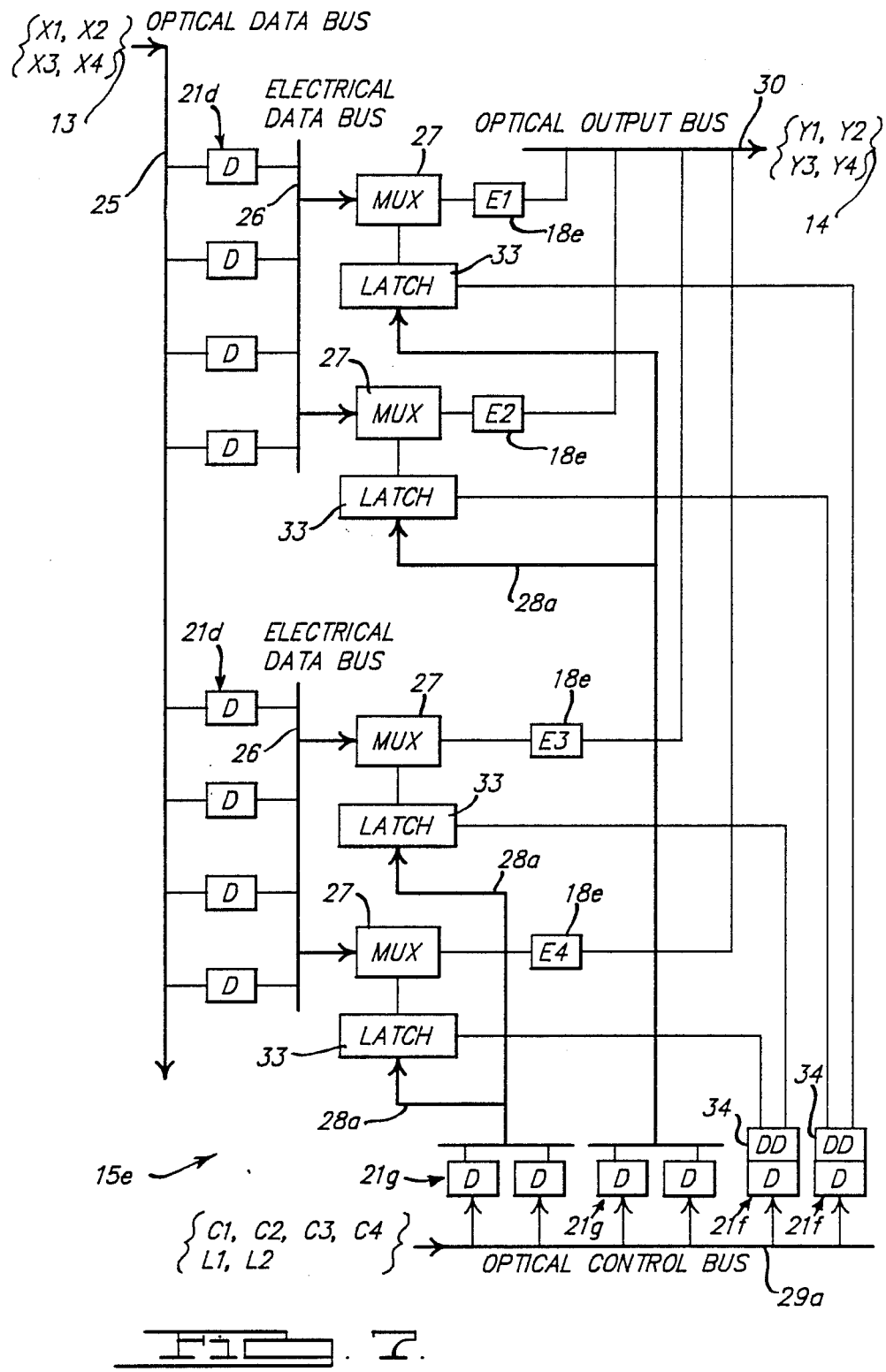
FIG. 7 depicts a specific example of a multiplexer and latch based synchronous 4×4 crossbar switch with bit-slice reconfigurability that is effected in accordance with the architecture of FIG. 2.

As shown in FIG. 7, the generalized architecture of FIG. 2 may also be specifically applied to the truth table of FIG. 1 to effect a synchronous multiplexer based 4×4 noncontending crossbar switch 15e with bit-slice reconfigurability. For purposes of clarity, some of the details of FIG. 2 are omitted from the schematic illustration of crossbar switch 15e in FIG. 7. Input control variables are indicated by symbols C1, C2, C3, C4, L1 and L2 and input data variables are indicated by symbols X1, X2, X3 and X4. Optical input signals X1 through X4 from an optical data bus 25 are fanned-out to two sets of detectors 21d. The electrical outputs of detectors 21d are respectively connected to two electrical data busses 26 that separately fan-out the electrical signals to each of two multiplexers 27. Control inputs to each set of two multiplexers 27 are supplied from two pairs of latches 33 that are in turn supplied from one of two separate electrical control busses 28a. Each of the two pairs of latches 33 is enabled sequentially by use of a decoder 34 that is activated sequentially by an electrical input supplied from a detector indicated generally by the alphanumeric symbol 21f. The detector 21f in turn is supplied by optical signals L1 and L2 originating sequentially from an optical control bus 29a. The input to the two electrical control busses 28a is supplied from a set of four detectors 21g that are in turn supplied by optical input signals C1 through C4 originating from an optical control bus 29a. The electrical outputs of the multiplexers 27 are individually connected to optical emitters 18e. The emitters 18e then drive an optical output bus 30 to provide the desired four output functions Y1, Y2, Y3 and Y4. The multiplexers 27 in effect provide all of the required fan-in factors and eliminate the need for optical fan-in. The fan-out factor provided by the electrical data bus also reduces the optical fan-out requirements that would otherwise be necessary. The foregoing additions of combinational logic shown in the form of decoders 34, and the addition of memory elements, shown in the form of latches 33, to the previous implementation of FIG. 6 thus permits sequential activation of the multiplexers 27, thereby reducing the total number of control bits, detectors, and system cost at the expense of reconfiguration time. This mode of operation necessitates synchronous operation. As before, mixing and merging electronic fan-out factors and electronic fan-in factors with incoming and outgoing optical signals reduces the total number of optoelectronic emitters and detectors and again lowers the overall cost of the crossbar switch.

The various embodiments depicted in FIGS. 4, 5, 6 and 7 demonstrate methods and apparatus for a variety of truth table based hybrid optical/electronic noncontending NxM crossbar switches with bit-slice reconfigurability that overcome many of the restrictions of previous crossbar switches in terms of being able to achieve both high data rates and high reconfiguration rates.

Returning now to the first embodiment 15 presented herein as depicted in FIGS. 2A and 2B, further clarification will now be provided as to how system 15 is capable of realizing any general digital logic operation, including combinational and/or sequential logic. In particular, it is necessary to more closely examine the cross connection array 20 that contains fiber coupled detectors 20e, internal logic, and fiber coupled emitters 20e. Further details will be provided here on the ability to mix and merge electronic fan-out factors, electronic fan-in factors and electronic logic with the incoming and outgoing optical signals As previously discussed, the incoming optical signals are generated by two orthogonal linear arrays of emitters 18 and 18a, at least one of which is employed to provide an optical fan-out factor exceeding unity. That is to say that the optical fan-out factor along the column axis of the cross connection array 20 can be less than or equal to the N columns depicted in system 15, whereas the optical fan-out factor along the row axis of the cross connection array can be less than or equal to the M rows depicted in system 15, but under no circumstances can both the row and column fan-out factor be reduced to unity. The manner in which the system 15 can be used as a generalized crossbar apparatus or system will be made clear from the Figures and following discussion.

FIGS. 8A and 8B depict the concepts of fan-out and fan-in. In FIG. 8A, a digital input signal 40 is applied to left end of line 42 and propagates to the right to node 44, where it is divided into four separate paths 46 with each path carrying the same digital signal 40. FIG. 8B shows that four distinct digital signals 50a through 50d can be applied to the left end of respective ones of lines 52 and propagate toward the right to node 54, where the signals are combined into a single signal that travels rightwardly along line 56. Those skilled in the art will appreciate that fan-out and fan-in as shown in FIG. 8 can be achieved both electrically and optically. Moreover, the number of fan-out lines 46 or fan-in lines 52 is only limited by the physical limitations of a particular application. Given sufficient physical space, input power, and heat dissipation capability, the number of lines 46 and 52 which are possible can be very large, on the order of several tens or several hundreds of lines or more.

FIGS. 9A and 9B respectively illustrate possible implementations for achieving fan-out and fan-in electrically. FIG. 9A shows input signal 40 applied to the input line 62 of a conventional electronic amplifier 64 which boosts the power of the signal 40 before applying it to output conductor 65, which is later divided into a plurality of electrical traces or paths 66. FIG. 9B shows a conventional digital logic OR gate symbol 74 having inputs 72 which receive four different logic signals 50, logically OR them together, and produce a single output line 76. Those skilled in the art will appreciate that the number of output lines 66 in FIG. 9A and that the number of input lines 72 in FIG. 9B can be increased dramatically if desired, provided that proper well-known circuit design procedures are followed.

FIG. 10 is a simplified exploded view of an optical fiber interconnection and signal transmission system 80 which includes a light emitting device such as photodiode 82 and a light detecting device such as photodiode 84. Optical system 80 also includes two large diameter optical fibers 86 and 88, and a plurality of smaller optical fibers 90a through 90g. Note that the ends of all of the optical fibers are preferably polished, as is conventional in the optical fiber art. The fibers are shown held together and in place by conventional means such as heat-shrink tubing, connectors or strap-like bands 92 in several locations, particularly at the bundled input end 96 and bundled output end 98 adjacent the first and second large fibers 86 and 88 respectively. The photo emitter 82 is driven by a driver circuit 102 which conditions a digital input signal provided on line 104. Resistor 106 serves to limit the current provided to photodiode 82 to a safe value. The photodetector 84 is connected to a conventional threshold detecting circuit 112 which produces a digital output 114 when the input voltage (or current) level on line 116 is larger than the predetermined threshold voltage (or current) provided to the circuit 112 by a signal on line 118. The internal designs of a driver circuit 102 and threshold detecting circuit 112 are strictly conventional and do not constitute part of the present invention.

In practice the optical system 80 shown in FIG. 10 does not include the physical gaps 125 and 128, shown between the diodes and large fibers and the bundled ends, and the large optical fibers. Instead the gaps are eliminated by having the diodes 82 and 84 in very close proximity to large fibers 86 and 88, and by having the ends of the small fibers 90 bear directly against the large fibers 86 and 88.

In operation, the system 80 in FIG. 10 works as follows. The emitting device 82 produces light represented by arrow 134 which is delivered to the near end 136 of large fiber 86 which may be several millimeters to several centimeters or more in length. The light 86 diffuses in the optical fiber due to diffraction and internal reflection and is uniformly provided to the smaller optical fibers 90, as represented by the set of four arrows 132. From there the light is guided through the individual small optical fibers 90 to any desired destination which may be several centimeters to several meters (or more) away. For example, the light in small optical fiber 90a travels as indicated by arrow 132b and emerges at end 98 as indicated by arrow 132c, to large optical fiber 88. Different optical signals, such as signals 138 and 140 are also provided to large optical fiber 88 by other optical fibers 90e and 90f. All of these signals are presented to photodetector 84, as indicated by arrow 142. The threshold detecting circuit 112 is adjusted so that any one of the optical signals 132, 138 or 140 will cause the output 114 of circuit 112 to change state, e.g., change from logical "0" to logic "1" (or vice versa).

From the foregoing, it should be clear that optical fan-out is effected by large fiber 86 directing the same optical signal to small fibers 90 at bundled end 96, and that optical fan-in is effected by the bundled end 98 directing distinct optical signals to large optical fiber 88.

Figure 11:
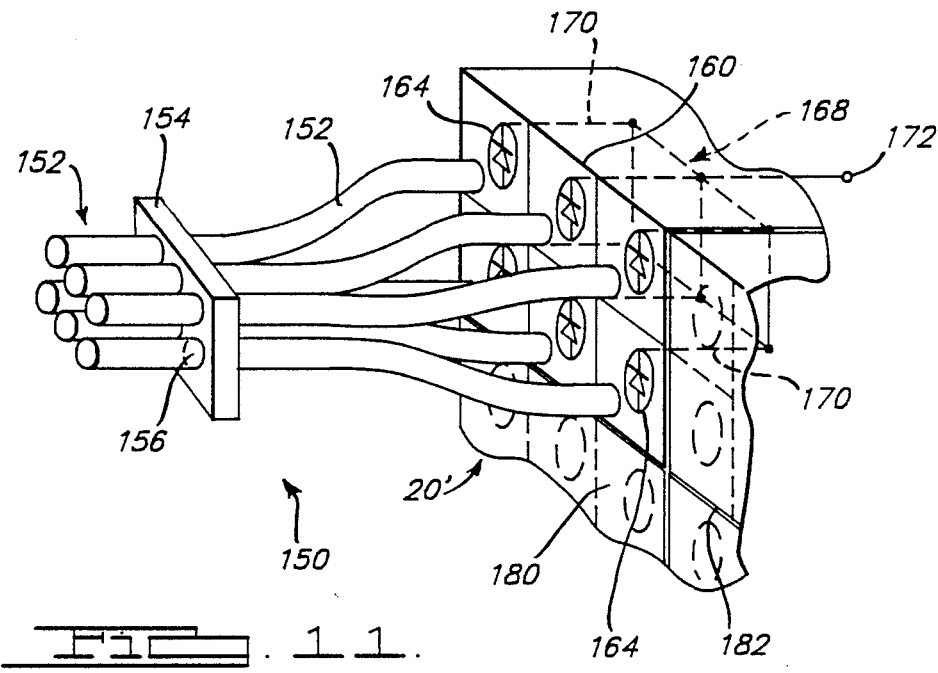
FIG. 11 depicts in simplified exploded perspective form another possible way of accomplishing a fan-in optoelectronically using equal numbers of optical fibers and detecting photodiodes.

FIG. 11 depicts a group 150 of fiber optic interconnects (i.e., optical fibers), each of which is being used to optoelectronically achieve fan-in. The group 150 includes six optical fibers 152, a rectangular support block 154 with six holes 156 through which the fibers 152 pass. A corner of a cross connection array 20' is shown. The heavy rectangle 160 represents a single photodetecting location or element of the array 20'. This location 160 corresponds to photodetector cell or location 20-11 of array 20 shown in FIG. 2A. In FIG. 2A a single detector 20d is shown in location 20-11. In contrast, this same location in the FIG. 11 array 20' has six photodetectors 164 arranged in a two row by three column matrix. These detectors 164 may be any suitable photodetecting device including phototransistors, photodiodes (as shown), avalanche photodiodes or photoresistors. FIG. 11 shows that individual ones of the optical fibers 152 are physically arranged with their light emitting ends in close proximity to a respective one of the photodetectors 164 and each presents a distinct and independent optical signal to a respective one of the detectors 164. As shown in phantom an array 168 of conductors 170 connect in parallel the electrical outputs of detectors 164 to a common output terminal 172. In this manner any one or more optical signals received by detectors 164 from fibers 152 will cause an electrical output at electrical terminal 172. As suggested by the circles in phantom in FIG. 11, each of the locations of the array 20 will have a plurality of individual optical detectors, as indicated by dotted circles in locations 180 and 182 of array 20' in FIG. 11.

Figure 12:
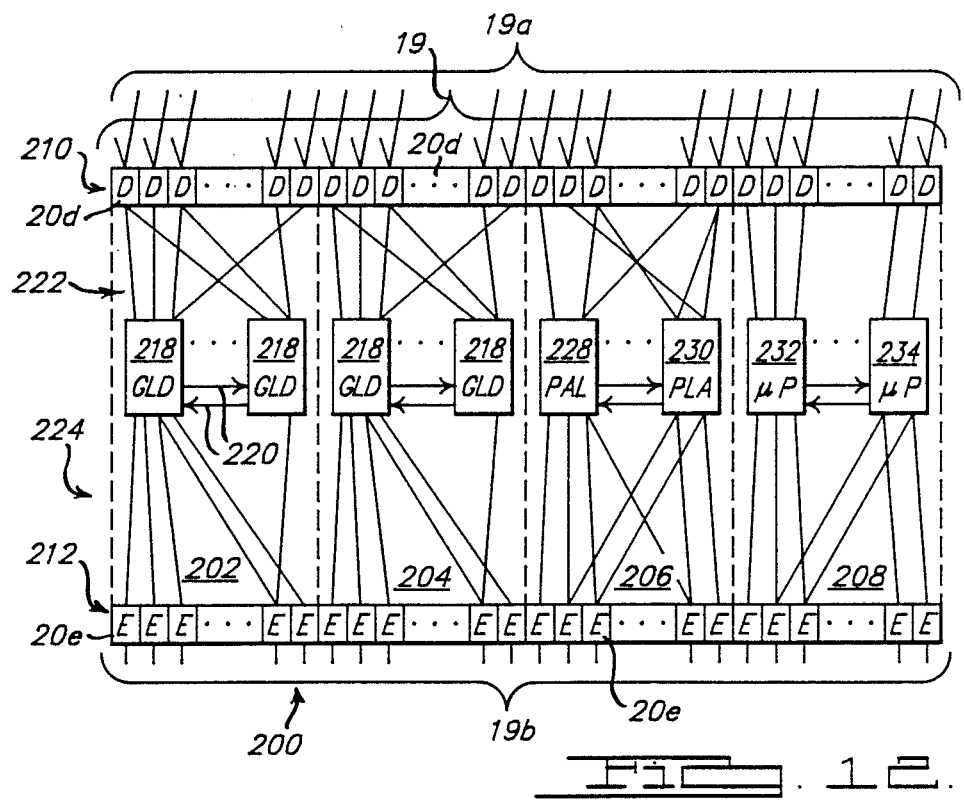
FIG. 12 schematically depicts one possible N×M cross connection array of the type shown in FIG. 2, with the four rows of boards shown side by side rather than stacked as in FIG. 2.

FIG. 12 shows one possible cross connection array 200 of the present invention, which may be utilized in the same general manner as array 20 shown in FIG. 2. Thus, for example, fiber optic interconnects 19 and 19a may be used to deliver optical input signals, while fiber optic interconnects 19b may be used to guide optical output signals of array 200 to their destination. Array 200 is comprised of four sections 202 through 208 which may all be identical, like sections 202 and 204 are, or which may be different from one another in various ways, as exemplified by but not limited to the differences between sections 204, 206 and 208. The sections 202-208 are preferably each constructed on individual printed circuit (PC) boards with a row of detectors 210 provided along one edge of the board and a row of emitters 212 provided along another preferably opposite edge (or side) of the board. Each of the boards 202-208 is provided with one or more logic devices which are each preferably connected to the row 210 of detectors 20d and a row 212 of emitters 20e. The logic devices may, if needed, be interconnected to one another. On board 202, for example, a plurality of general logic devices (GLDs) 218 are provided and are interconnected with one another via conductors 220 in conventional fashion. GLDs 218 are also in communication with detectors 210 by signal paths 222 and with emitters 212 by signal paths 224. Signal paths 220, 222 and 224 are preferably metal traces conventionally formed on a PC board, and may be arranged if necessary in multiple layers using conventional techniques.

Each of the general logic devices 218 may be any conventional or suitable electronically-operated digital logic device, including without limitation, a PLD, ROM, RAM or ASIC device or a microprocessor or other processor devices. The specific interconnections 222 and 224 required between such general logic devices 218. as well as interconnections 220 therebetween, will be determined by the specific application to which the cross connection array of the present invention is to be put.

The use of programmable logic devices (PLDs) such as the programmable array logic (PAL) device 228 or the programmable logic array (PLA) device 230 shown in section 206, for example, enables a wide variety of digital logic functions to be carried out within the cross connection array 200. Similarly, microprocessors 232 or processors 234 shown in section 208 enable still further digital logic functions to be carried out. The use of dynamic or active logic devices such as RAMs or processors within the sections of array 200 also enables the array to be dynamically reprogrammed within a matter of one to several tens of clock or transmission cycles of the data being received by the detectors 20d. Thus, the electrical interconnections 210 to the output emitters 212 can be reprogrammed dynamically under program control and/or under control of signals received via the input detectors 210.

For example, the electrical interconnections used to pass data through section 208 can be reprogrammed if desired based upon the results of computations performed by the processors 232 and/or 234. Thus it will be understood that virtually any type of combinational logic, sequential logic and the mixtures thereof and virtually any type of electrical interconnection reconfiguration scheme may be implemented using the cross connection array 200.

The FIG. 12 array 200 may be physically arranged by having several PC boards 238-244 side by side as shown, or may be arranged by stacking the PC boards one above the other, so as to create a physical stack resembling the cross connection array 20 shown in FIG. 2. Alternatively, the PC boards may, if desired, be spaced apart at physically distinct locations, as is the impression created by considering PC boards 238 through 244 shown in FIGS. 13A through 13D as a set of spaced apart boards.

The various PC boards shown in FIG. 13 may also be employed in the cross connection arrays of the present invention. These boards may be substantially identical to the type of boards shown in FIG. 12, and are included to further emphasize the multitude of possible combinations of logic devices and digital logic functions that can be electronically performed within the cross connection arrays of the present invention. FIG. 13A shows a PC board 238 including a plurality of PLDs 248 interconnected between rows of input detectors 210 and output emitters 212.

FIG. 13B shows a PC board 240 usable to implement an optically accessed electronic mass storage device. Board 240 includes a plurality of ROMs 250 interconnected between detectors 210 and emitters 212. In operation, address information is provided by digital signals arriving optically at detectors 210, which is then converted to electrical signals that are applied to conductors 222 to select the specific integrated circuit chip(s) of and memory location(s) in the ROMs 250 from which stored data is to be obtained. Appropriate timing and/or control signals can also be delivered concurrently (or sequentially) via detectors 210 to ensure proper conventional timing relationships are observed as maybe necessary for reliable transfer of stored data from the ROMs. The data thus retrieved is electrically output via conductors 224 to emitters 212 which optically transmit the data via optical fibers 19b to specific destination detectors ready to receive the retrieved data.

It should be noted that the crossbar switch apparatus of the present invention overcomes one of the major drawbacks of conventional very large random access memories, namely that the bandwidth of the buses or other access routes for such information is limited. For example, beyond a certain number of memory boards, the input/output ("I/O") access time is constrained by electrical bus size and number of connections made to the bus. The optically connected buses of the present invention based on suitable use of fan factors overcomes this limitation. For example, one hundred gigabytes of a random access memory could be provided upon one hundred boards of one gigabyte each, each connectable to an optical bus (i.e., a subset of fiber optic interconnects going to a specific memory board) in one or more of the configurations described in this patent application. Since the hybrid electrical/optical pathways to each such board can be made to have a very large bandwidth, access times to individual memory locations can be great. Further, in a multi-processor environment, the cross connection array configurations of the present invention enable any portion of the overall system can be connected to any other portion of the system at reconfiguration rates approaching the access times of individual memory location.

FIG. 13C shows a PC board 242 having a plurality of RAMs 252 which are addressed via address and control signals provided by conductors 222 which are driven by detectors 210. In a manner identical to that of the FIG. 13B board, stored data is transferred via traces 224 to emitters 212 for optical broadcast via optical interconnects 19b to remote detectors. By sequentially providing address and data information to detectors 210, both the RAMs 252 on board 242 can also be dynamically updated with new information (e.g., data) to be stored therein. Timing and control signals can be provided by one or more optical signals applied to one or more detectors 210. Those skilled in the art will appreciate that data, addresses, control and/or timing signals may be provided in parallel for quicker access by providing a sufficient number of detectors 210.

FIG. 13D shows a PC board 246 having a plurality of ASIC devices 256 electrically interconnected between selected detectors 210 and selected emitters 212. As those in the art will appreciate, such ASICs can be constructed and/or programmed to perform an almost limitless number of combinational and/or sequential digital logic functions.

FIGS. 12 and 13 show that a plurality of detectors 210 and 212 may be used with each of the boards 202-208 and 238-244. Those skilled in the art will appreciate that the number of detectors and emitters used in each board may be varied as needed to suit application requirements. For example in FIG. 12, each of the boards 202-208 may be provided with 24 detectors 210 and 16 emitters 212. Alternatively the number of detectors or emitters can be raised or lowered individually with regard to any board. Also, it is not necessary for each board used in the cross connection array to have the same number of detectors or emitters as the other boards (if any) used in the array. For example, boards 202 and 204 may have sixteen emitters 212, while boards 206 and 208 may respectively have twenty-four emitters and eight emitters. Moreover, in each of the boards shown in FIGS. 12 and 13, single detectors may be employed for each input location of the cross connection array, as illustrated in FIG. 10, or multiple photodetectors may be employed at each input location, as illustrated in FIG. 11.

Figure 14A:
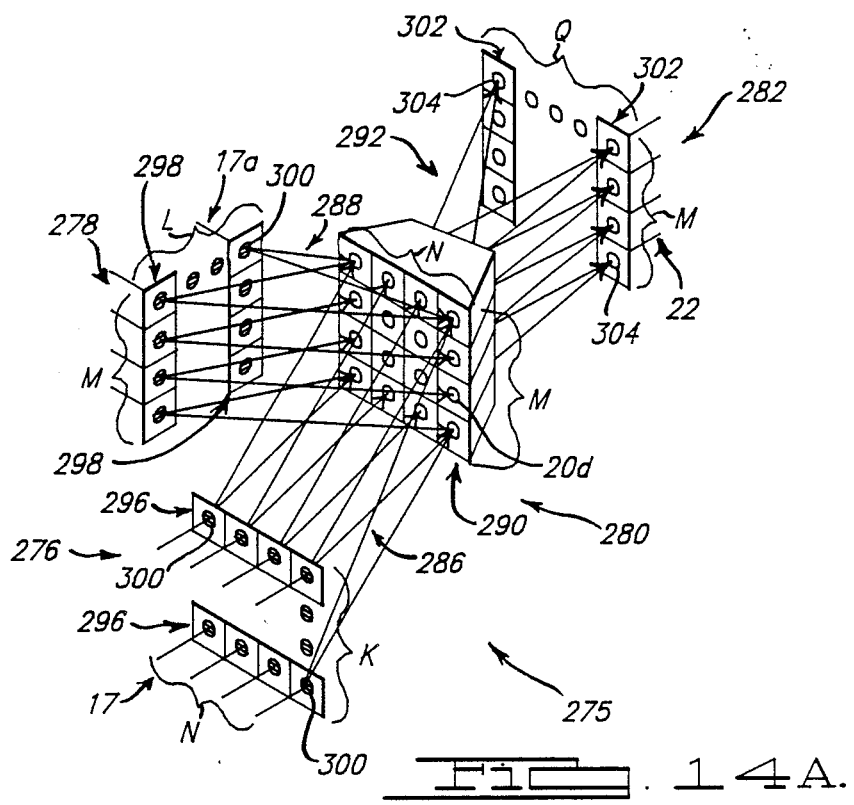
FIGS. 14A and 14B depict front and back views, respectively, of a generalized architecture employing a fiber connected cross connection array and two sets of orthogonal input arrays and one set of output arrays for implementing general digital logic functions.
Figure 14B:
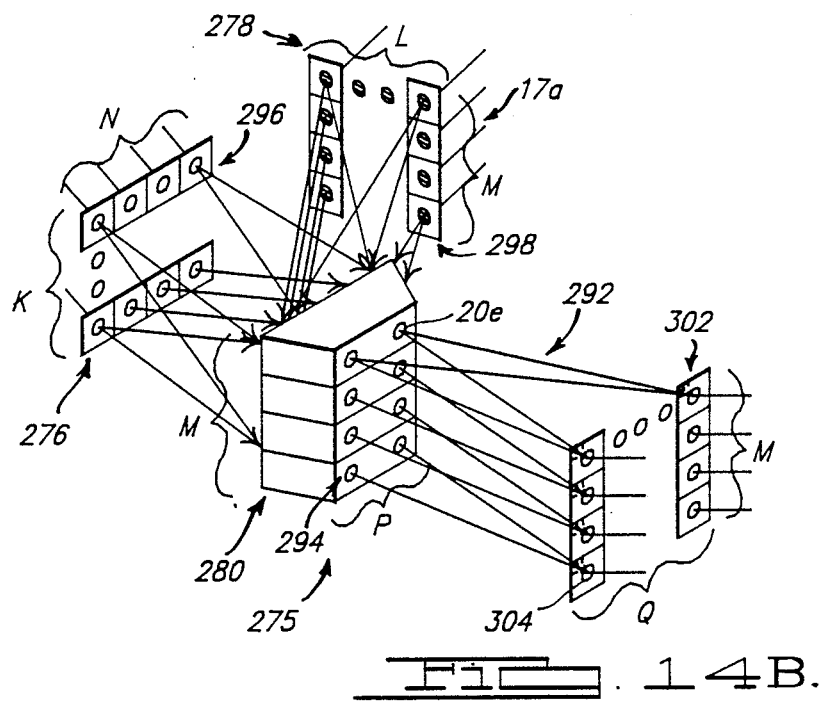

FIGS. 14A and 14B show front and back perspective views of a sixth embodiment of the present invention, which may be called cross connection apparatus or system 275. The system 275 includes: two matrix arrays 276 and 278 of input emitters, a cross connection array 280 including input detectors, output emitters and embedded electronic digital logic, and a matrix array 282 of optical output detectors. The optical input arrays 276 and 278 are connected by groups 286 and 288 of fiber optic interconnects to the input matrix array 290 of optical signal detectors 20d on a first side of cross connection array 280. A group 292 of fiber optic interconnects provides separate paths for carrying the optical output signals from the matrix array 294 of emitters 20e of the cross connection array 280 to the matrix array 282 of output detectors 3. The crossbar switch apparatus 275 of FIG. 14 is preferably substantially identical in terms of construction to crossbar switch apparatus 15 shown in FIG. 2, except that it is larger, i.e. has more inputs and outputs, and has a different size output matrix for detecting optical output signals, as will now be explained.

The hybrid optical/electronic crossbar switch apparatus 275 of FIG. 14 has two input matrix arrays 276 and 278 which respectively have dimensions of $N \times K$ and $L \times M$. In other words matrix array 276 includes K linear input arrays 296, each of which has a plurality of emitters for converting to first digital electrical input signals 17 to a greater number of first optical input signals delivered to the fibers 286. The fibers from each emitter 300 of the array 276 carry the optical input signal produced thereby to a respective column of the $N \times M$ detector array 290 of cross connection array 280. Each of the linear arrays 296 preferably has N elements but may have less if desired.

Similarly, input matrix array 278 has L linear arrays 298 of emitters 300 for converting a second plurality of electrical signals delivered on conductors 17a to a greater number of optical input signals delivered via fibers 288 to respective rows of detectors 20d on array 280. Each linear array 298 preferably has M emitters 300 but may have less if desired.

The output detector array 282 has Q linear arrays 302 of individuals detectors 304 which detect respective sets of optical output signals from output matrix array 294 of the cross connection array 280. The linear arrays 302 preferably each have M detectors 304, but may have less if desired. The detectors 304 preferably convert the detected optical output signals to digital electrical signals which are delivered to respective output conductors 22.

The cross connection array 280 has an input matrix 290 of N columns by M rows with optical detectors 20d at each location of the matrix which convert optical input signals into a digital electrical signals for use within the cross connection array 280. The output emitter array 294 of cross connection array 280 has P columns x M rows of light emitting devices 20e as best seen in FIG. 14B.

Thus, the FIG. 14B apparatus 275 has two input matrix arrays 276 and 278 of electrical/optical emitters of dimensions $N \times K$ and $L \times M$ and a single matrix array 282 of opto/electronic detectors of dimensions $Q \times M$. As those skilled in the art will appreciate, the apparatus 275 shown in FIG. 14 may be used to interconnect a great number of digital processor systems together in a hybrid electrical/optical manner which is dynamically reprogrammable at high-speed due to embedded digital logic in the cross connection array 280.

Figure 15A:
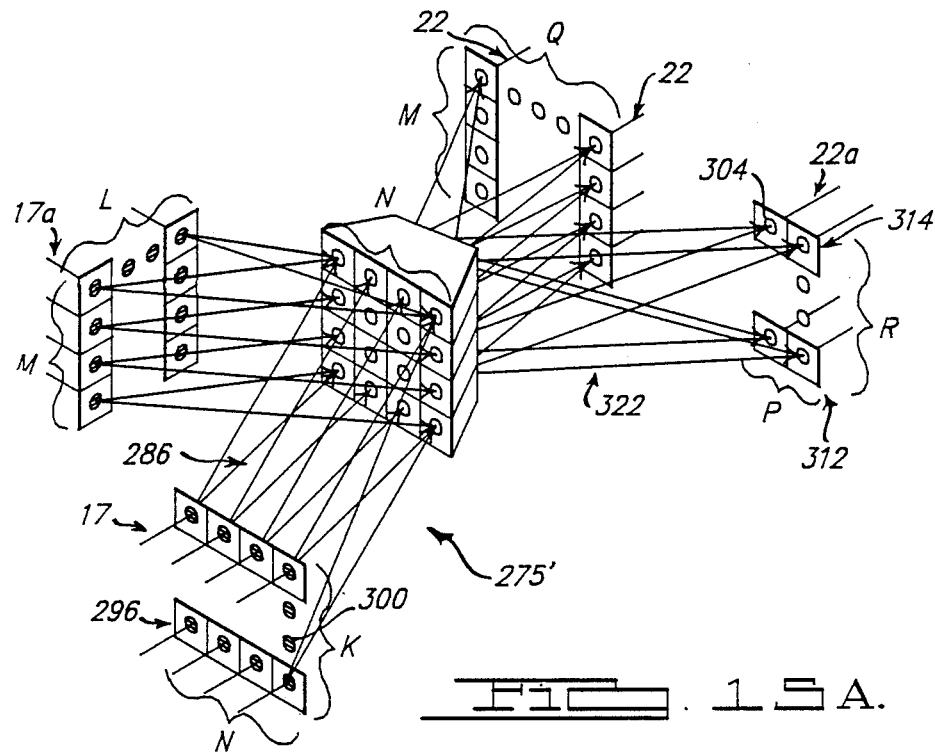
FIGS. 15A and 15B depict front and back views, respectively, of highly generalized architecture including a N×M×P cross connection array having two sets of input arrays and of output arrays for implementing general digital logic.
Figure 15:
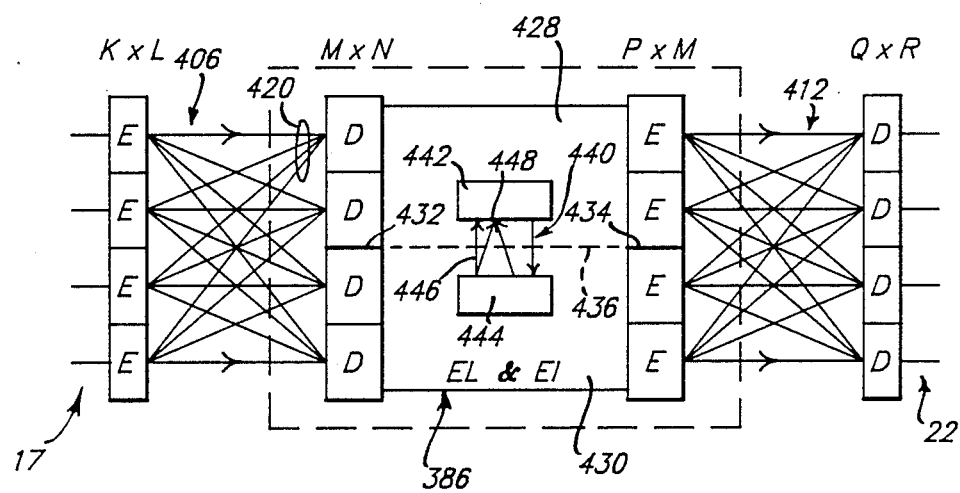
Figure 15B:
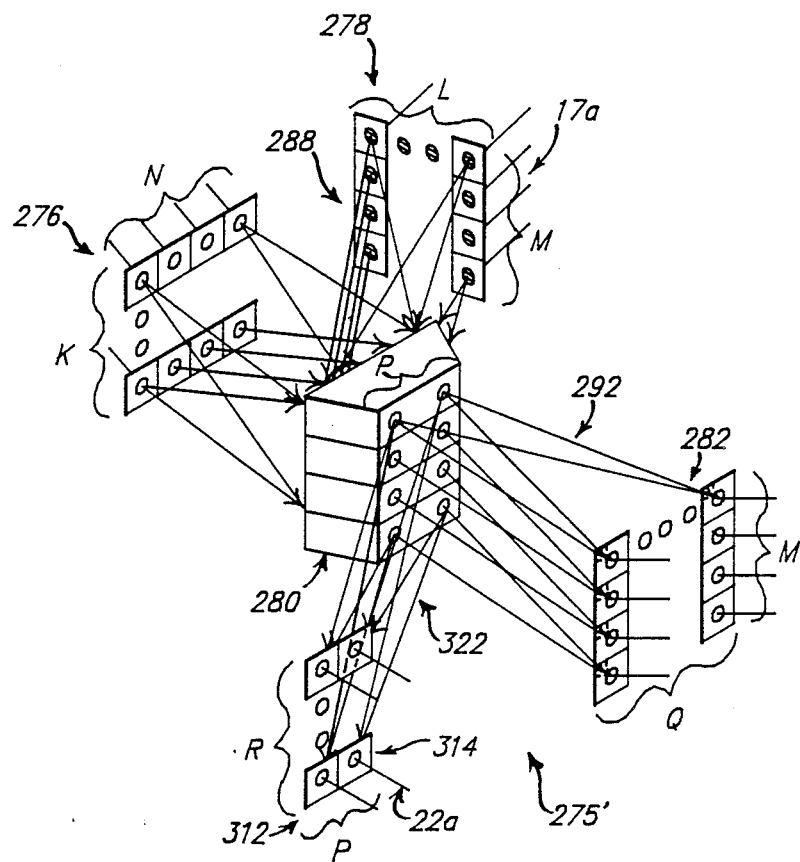

FIGS. 15A and 15B show front and back perspective views of a cross connection apparatus 275' which is identical to the sixth embodiment shown in FIG. 14, except for an additional output matrix array 312 of detectors 304 and corresponding group 322 of fiber optic interconnects. Detector array 312 has R linear arrays 314 of detectors 20e, with each such array 314 containing R detectors, as shown. The interconnects 322 are arranged as shown so that each column of outputs of emitter array is delivered to the P detectors 304 in s respective row 314 of detector array 312. In both the FIG. 14 apparatus 275 and the FIG. 15 apparatus 275', the two input arrays 276 and 278 present to the input detector matrix 290 linear arrays of optical signals which are orthogonal to one another. Similarly, in the FIG. 15 apparatus 275, the interconnects 292 and 322 deliver optical output signals from the emitter array 294 of cross connection array 280 to output arrays 282 and 312 receive in an orthogonal manner. Further, the apparatus 275 may be said to have six dimensions, namely, K, L, M, N, Q and P. Similarly, the apparatus 275' of FIG. 15 may be said to have seven dimensions, namely, K, L, M, N, P, Q and R.

Figure 16:
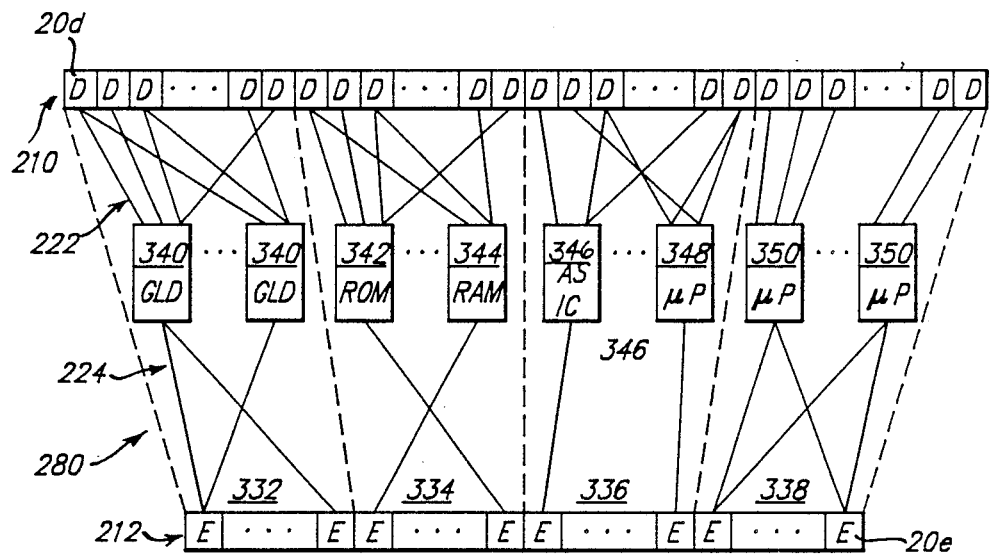
FIG. 16 schemstically depicts four printed circuit boards for the cross connection array of FIG. 15 side by side, rather than stacked, as shown in FIG. 15.

FIG. 16 shows one possible configuration for the cross connection array 280 used in the FIGS. 14 and 15 apparatuses. Like FIG. 12, the array 280 is shown as having four PC boards numbered 332 through 338, and each of the boards contain a plurality of logic devices 340 through 350 as shown. Each of the boards in array 280 preferably has a row 210 of detectors 20d along one edge of the board and a row 212 of emitters 20e along another edge of the board. However, those skilled in the art will appreciate that if desired the emitters and detectors may be placed at or near a common edge of the board, or on opposite sides of the board. Like in FIG. 12, FIG. 16 shows that the boards may conform identical digital logic devices, like boards 332 and 338 which respectively have a plurality of general logic devices 340 and a plurality of processors 350 The trapezoidal shape of the array 280 in FIG. 16 is meant to represent that the number of detectors 20d in rows 210 is different from the number of emitters 20e in rows 212, which corresponds in this case to the value of N being greater than P.

Figure 17:
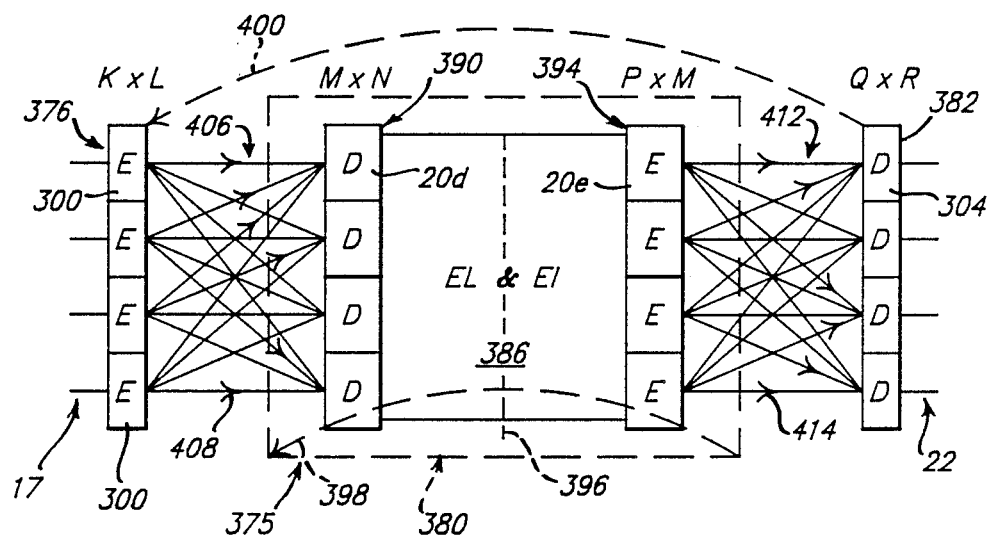

FIG. 17 shows in highly schematic form an eighth embodiment of the present invention, namely cross connection apparatus 375. Apparatus 375 includes: input matrix array 376, a cross connection array 380 including network 386 of electronic logic and electronic inerconnects (EL & EI) detector array 390 and output emitter array 394, and an output detector array 382, all shown laid out flat and interconnected by optical fibers. Those skilled in the art will appreciate, based upon the description herein, that the crossbar switch apparatus 375 may be configured in any desired three dimensional arrangement. For example, the apparatus 375 can be folded in half along central vertical line 396 as indicated by dotted arrows 398 and 400 so that the input array 376 and output array 382 are located physically close together. In such an arrangement, all of the electrical input signals 17 and output signals 22 would then be found in roughly the same general location for ease of connection thereto.

As shown in FIG. 17, the various arrays of apparatus 375 have the following dimensions: input array 376 is $K \times L$, optical detector array 390 is $N \times M$, output emitter array 394 is $P \times M$, and output detector array 382 is $Q \times R$. A group 406 of fiber optic interconnects may be provided to connect each of the emitters 300 of input array 376 to each of the detectors 20e of input detector array 390 of the cross connection array 380. Similarly, a group 412 of fiber optic interconnects provides a distinct fiber-coupled path between each of the output emitters 20e of array 394 and the detectors 304 of output detector array 382. The direction of signal travel is indicated by arrowheads 408 and 414 on the lines representing the optical fibers 406 and 412. Those skilled in the art will appreciate that this arrangement of fiber optic connections between emitters and detectors on both the input and output sides of the cross connection array 380 effectively permits any optical input signal from input emitter array 376 to be provided to any optical input detector 20d, and allows any output signal from any emitter 20e to be transmitted to any output detector 382. In FIG. 17 the dimensions K, L, M, N, P, Q and R are shown as all equaling two. Those skilled in the art should appreciate, however, that each of these dimensions may be made any arbitrary size as may be required by any given crossbar switch application. However, as noted in the Summary portion of this application, the optical fan-out factor must exceed unity along at least one of the input arrays.

The connection of every input emitter 300 to every input detector 20d requires a global set of fiber optic interconnections, i.e., K×L×M×N optical fibers. In other words all possible interconnections must be made. Likewise the interconnection of every possible output emitter 20e to each possible detector output 304 requires a global set of fiber optic interconnections as well, i.e., M×P×Q×R optical fibers. The use of fiber optic interconnects is an important aspect of this and other embodiments of the present invention, since it dramatically opens up the number of practical configurations in which the input arrays, output arrays and cross connection array may be arranged. In particular, since optical fibers are very tiny (e.g., 3 microns to about one centimeter in diameter typically), very flexible, and substantially lossless transmission paths for appropriately selected wavelength optical signals passed therethrough over short distances (up to several tens or even several hundreds of meters), different portions of the crossbar switch apparatuses of the present invention be positioned remotely from one another. This is not possible with conventional crossbar switches which rely on free-space transmission of optical signals to achieve fan-out optically, or electrical crossbar devices which achieve fan-out electrically through high capacitance buses. Also, optical signals in such conventional free-space optical systems are attenuated by the loss of power in accordance with the square of the distance.

The use of fiber optic interconnects in crossbar switches, especially with the FIG. 17 architecture, can lead to problems, as is further discussed below. However, the architecture of apparatus 375 in FIG. 17 does provide the great benefit of allowing any desired electrical input signal on line 17 to be provided as an optical input signal to any detector 20d of array 390. Similarly, it permits any output detector 20e of array 394 to be interconnected to any output detector 304 of array 382, regardless of the row or column in which such detector may be located. Those skilled in the art should appreciate that is not necessary to locate the elements in the arrays 376, 382. 390 or 394 in a conventional row and column configuration. Instead, these elements may be located anywhere it is practical to do so in three dimensional space and simply use optical fibers and/or electrical conductors, to make the necessary optical and/or electrical interconnections to other devices, since both of these types of signal paths can be twisted to follow almost any desired path.

FIG. 18 shows a modified version of the eighth embodiment of the present invention, namely the crossbar switch apparatus 375'. This apparatus is identical in all respects to apparatus 375, except for several features which will now be explained. First, apparatus 375' uses opto/electronic fan-in of the type shown in FIG. 11. This is graphically illustrated by having the groups of lines representing fibers shown separately entering each detector element of the detector arrays 382 and 390. For example, the four optical fibers 420 entering the first detector 20d of input array 390 are spaced apart from one another, whereas the same group of four fibers 420 in FIG. 17 are shown arriving at a single point, as would be the case if optical fan-in of the type depicted in FIG. 10 is employed in the FIG. 17 apparatus.

FIG. 18 has a series of heavy dark lines 432 and 434 and dotted line 436, which are intended to represent the physical separation between two separate PC boards 428 and 430 which may be used to construct and comprise the electronic logic and electronic interconnect (EL & EI) network 386. In order to permit communications between the two distinct boards, signal paths 440 are provided via appropriate interface circuits 442 and 444, if necessary. Such interconnections 440 may be made using electrically or optically, such as by use of electrical conductors or optical fibers. Fan-in and fan-out of the optical and/or electrical variety may be utilized as indicated by the arrangement of arrows 440 at locations 446 and 448 respectively.

The number of PC boards and the dimensions of the arrays shown in the FIG. 18 apparatus are all depicted as being two for convenience in illustrating same. Those skilled in the art should appreciate, however, that the value of dimensions K through R and the number of boards used in the apparatuses 375 or 375' of FIGS. 17 and 18 is only limited by usual conventional restraints of physical space, available input power, desired bandwidth or processing speed and heat dissipation requirements. Within these general constraints, it should be understood that the apparatuses FIG. 17 and 18 are well suited to implement an extremely wide variety of digital logic functions using any of the cross connection arrays and PC boards heretofore described in this application.

The objective of the foregoing general cross connection architectures described with respect to FIGS. 2 and 8 through 18 is to achieve universal flexibility so that any single or multi-dimensional array of inputs may be delivered to and if desired processed by the cross connection array in order to produce any desired matrix of outputs. However, this universal mapping of a matrix of inputs to a cross connection array and on to a matrix of outputs is inherently difficult in the real world due to the vast number of interconnections required. For example, in FIGS. 17 and 18 there is shown a 2×2 input matrix connected to a 2×2 cross connection array which has emitters and detectors. The emitters of the cross connection array are coupled to a 2×2 matrix of output detectors which provide electrical signals. Thus the number of inputs is K×L. The number of outputs is Q×R. The number of the detectors on the cross connection array is M×N, and the number of emitters on the cross connection array is M×P. Thus for a completely generalized fiber connection network between the input matrix and the cross connection array, that is a global set of input interconnects, the number of fibers required is K×L×M×N. For the interconnections between the emitters of the cross connection array and the output matrix, that is a global set of output interconnects, the number of fibers required is M×P×Q×R.

Even when the size of each of these 7 dimensions (K, L, M, N, P, Q, R) is limited to 8, the number of optical fiber interconnects required is vast, approximately $2 \times 2^{12}$ or 8,192. Because of the inherent physical difficulties and expense in wiring so many optical fibers, I have devised a method for achieving a substantially minimum cost, practically realizable implementation of my cross connection architectures for any given application. My method can be explained as follows.

First, I select a master subset of input interconnects, representing all needed interconnections between the input array and the cross connection array for the given application. Next, if necessary, I select a master subset of output interconnects, meaning all the needed interconnections between the cross connection array and the output matrix array needed for the application. Each of these master subsets consists of a set something less than the global set of interconnects. Finally, I provide or make all of the optical interconnects of the master input and master output subsets using optical fibers.

The master input subset for a given application for my hybrid optoelectronic cross connection apparatus is determined as follow. For the application, there will be a known or determinable number of desired optical interconnects, each of which will have a specific origin and a specific destination. All possible desired input interconnects are determined by analyzing the application to determine all the different working sets of input interconnections that may need to exist at any instant of time when the apparatus is operating. For example, it may determined that ten different working input subsets are required, each of which may have anywhere from one to several hundred interconnects. Amongst these needed working input subsets will normally be certain interconnects which are common, and some which are not. By "common" interconnects I mean two or more interconnects having the same origin and same destination. These common interconnects are identified. Then, the master input subset is selected to consist of all the different interconnections needed to achieve each of the working subsets with duplicate common interconnects being eliminated.

The same basic steps are used to obtain a master subset of output interconnects. All possible desired output interconnects are determined by analyzing the given application to determine all different sets of output interconnects that may need to exist in any instant of time when the system is operating. Then, the common interconnects of the working subsets are identified. Finally, the output master subset is selected to consist of all interconnections needed to implement each of the needed working output subsets, with duplicate common interconnections being eliminated. By using my method described above in conjunction with the cross connection apparatus of the present invention, the number of interconnects on the input and output sides of the cross connection array can be greatly reduced. For example, in one application the optical interconnects shown in Figures with arrowheads 408 and 414 might be eliminated. Also, any input detector locations which are not required to have a detector need not be provided with one. In a large cross connection apparatus, this number may be significant, particularly if the FIG. 11 fan-in method is used.

To utilize the cross connection apparatus of the present invention, one specific working input subset is utilized in connection with one specific working output subset. Additionally, the cross connection array, through use of selected digital logic functions and selective interconnections between points within the cross connection array causes a desired digital processing of input data. The resulting output data may be stored within memories within the cross connection array, or such data may be passed in whole or in part to the output emitters of the connection array. The specific one of the several input working sets which are provided is selected by the internal cross connection array design and configuration. Similarly, the specific one of the output working subsets which are provided is also selected in the same manner. The specific design and configuration of the cross connection array for a given application consists of appropriate electrical connections and digital logic. This logic may be combinational, sequential or mixtures thereof. Also, this logic may access stored values within the cross connection array resident in memory elements. As previously explained these memory may be read only memories or dynamically programmable memories. The logic may also be programmable, and operate to selectively receive or ignore electrical information placed on the electrical traces from the input detectors of the array or from devices within the array. The logic may also operate selectively apply or transmit data, control, and/or timing signals to output emitters of the array.

It is recognized, of course, that those skilled in the art may make various modifications or additions to the preferred embodiments chosen to illustrate the invention without departing from the spirit and scope of the present contribution to the art. For example, although the various $N \times M$ and $N \times M \times P$ crossbar switches and cross connection arrays described and shown herein have $M=4$, $N=4$ and $P=4$ or $P=2$, and one skilled in the art will readily appreciate that M, N, and/or P can have other values as well, such as 8, 16, 32, or more (or any numbers in between), with a suitable increase in the hardware needed for such larger implementations. Of course, the value of M need not be equal to the value of N, although in many applications it will be. Also, correlative terms such as "row" and "column", "vertical" and "horizontal", "left" and "right", and the like are used herein to make the description and/or claims more readily understandable, and not meant to limit the scope of the invention. In this regard, those skilled in the art will readily appreciate such terms are often merely a matter of perspective, and are interchangeable merely by altering one's perspective, e.g., rows become columns and vice versa when one's view is rotated 90 degrees. Accordingly, it is to be understood that the protection sought out to be afforded hereby should be deemed to extend to the subject matter claimed and all equivalents thereof fairly within the scope of the invention.

I claim:

1. A hybrid optical/electronic cross connection apparatus for implementing digital logic functions, the apparatus comprising:

first means for converting a plurality of input bits to a greater number of first optical input signals;

a cross connection array including (1) a plurality of first detector means each being for detecting a distinct one of the first optical input signals, (2) means for electrically performing digital logic operations within the cross connection array upon detected first input signals to produce electrical output signals, and (3) a plurality of means for producing optical output signals from electrical output signals;

a plurality of second detector means each being for detecting at least one of the optical output signals from the array;

a plurality of first optical fiber interconnects for carrying the first optical input signals to the first detector means of the cross connection array; and a plurality of second optical fiber interconnects for carrying the optical output signals to the plurality of third detector means.

2. A cross connection apparatus as in claim 1, wherein:
the input bits include control bits and data bits,
the first means for converting includes first and second sets of light emitting devices which respectively emit first and second optical input signals corresponding to control bits and data bits,
the means for performing digital logic operations performs digital logic operations upon detected input data signals under the control of detected input control signals.

3. A cross connection apparatus as in claim 1, wherein the means for electrically performing digital logic operations includes at least one programmable logic device.

4. A cross connection apparatus as in claim 1, wherein the means for electrically performing digital logic operations includes at least one random access memory device.

5. A cross connection apparatus as in claim 1, wherein the means for electrically performing digital logic operations includes at least one read only memory device.

6. A cross connection apparatus as in claim 1, wherein the means for electrically performing digital logic operations includes at least one application specific logic circuit device.

7. A cross connection apparatus as in claim 1, wherein the means for electrically performing digital logic operations includes at least one processor device.

8. A cross connection apparatus as in claim 1, wherein the plurality of first detector means of the cross connection array are arranged along at least M rows and at least N columns, and the plurality of means for producing optical output signals are arranged along at least M rows and P columns, where M, N and P are integers, and at least one of M and N has a value of at least two, and P has a value of at least one.

9. An optical fiber coupled hybrid optical/electronic cross connection apparatus including a cross connection array, the cross connection apparatus comprising:
a plurality of first fiber optic interconnects for providing optical digital input signals, said optical input signals including at least two fanned-out signals for transmission via at least two distinct first fiber optic interconnects; and
a cross connection array including: (1) an N×M array of detecting means, each such means being for detecting at least one optical digital input signal and generating a corresponding electrical digital input signal, where M and N are integers and at least one of them has a value of at least two; (2) means for performing digital logic functions upon at least some of the generated electrical input signals to produce a plurality of electrical output signals; and (3) an M×P array of emitting means, each such emitting means being for producing an optical output signal in response to an electrical output signal received thereby, where P is an integer and has a value of at least one.

10. A cross connection apparatus as in claim 9, further comprising:
M printed circuit board means, each such board means being for supporting N detecting means and P emitting means.

11. A cross connection apparatus as in claim 10, wherein the M printed circuit boards are arranged in a stack, one above the other.

12. A cross connection apparatus as in claim 10, wherein the M printed circuit boards are arranged side by side.

13. A cross connection apparatus as in claim 9, wherein the means for performing digital logic functions includes a plurality of substantially identical integrated circuit elements.

14. A cross connection apparatus as in claim 9, wherein the means for performing digital logic functions includes a plurality of integrated circuit chip devices containing digital logic selected from the group of circuit chip devices including read only memories, random access memories, microprocessors, programmable logic devices, and application specific integrated circuits.

15. A cross connection apparatus as in claim 9, wherein M has a value of at least two, and further comprising:
M printed circuit board means, each such board means being for supporting N detecting means and P emitting means and including at least one integrated circuit device containing digital logic circuits, the M printed circuit board means being arranged in a stack, and wherein
the means for performing digital logic functions includes a plurality of substantially identical integrated circuits, formed from at 16. A cross connection apparatus as in claim 9, wherein at least two of the first fiber optic interconnects are fanned-in to a common detecting means of the cross connection array.

17. A cross connection apparatus as in claim 9, further comprising:
a plurality of detecting means for receiving optical output signals, and
a plurality of second fiber optic interconnects for carrying the optical output signals from the array of emitting means to the plurality of detecting means for receiving.

18. A cross connection array as in claim 17, wherein at least one of the optical out put signals from the cross connection array is fanned-out via the second fiber optic interconnects to two distinct detecting means for receiving.

19. A cross connection array as in claim 17, wherein at least two of the optical output signals from the cross connection array are fanned-in to a common detecting means for receiving.

20. A hybrid optical/electronic cross connection apparatus for implementing digital logic functions, the apparatus comprising:
first emitter means for converting a first plurality of electrical input bits to a greater number of first optical input signals; second emitter means for converting a second plurality of input bits to a greater number of second optical input signals;
a cross connection array including (1) a plurality of first detector means each being for detecting a distinct one of the first optical input signals and a distinct one of the second optical input signals, (2) means for electrically performing digital logic operations within the cross connection array using at least selected ones of the detected first and second input signals to produce electrical output signals, and (3) a plurality of means for producing optical output signals from electrical output signals;

a plurality of second detector means each being for detecting at least one of the optical output signals from the array;

a plurality of first optical fiber interconnects for carrying the first optical input signals to the first detector means of the cross connection array;

a plurality of second optical fiber interconnects for carrying the second optical input signals to the first detector means of the cross connection array; and a plurality of third optical fiber interconnects for carrying the optical output signals to the plurality of third detector means.

21. A cross connection apparatus as in claim 20, wherein:

the first detector means of the cross connection array are arranged along at least M rows and at least N columns, where M and N are integers and at least one of which must have value of at least two; and the first optical input signals are delivered by the first optical interconnects to the detector means in a first direction, and the second optical input signals are delivered by the second optical interconnects to the detector means in a second direction orthogonal to the first direction, such that identical first optical input signals are delivered to at least one M row, and identical second optical input signals are delivered to at least one N column.

22. A cross connection apparatus as in claim 20, wherein:

the first emitter means includes an array of N light emitting devices spatially positioned along a first common line and producing the N first optical outputs, the second emitter means includes an array of M light emitting devices spatially positioned along a second common line and producting M second optical outputs, and said light emitting devices being selected from the group of light emitting devices consisting of semiconductor lasers and light emitting diodes.

23. A cross connection apparatus as in claim 22, wherein:

the first optical fiber interconnect means fan out each of the N optical outputs M times such that M×N first optical input signals are produced; and the second optical fiber interconnect means fan out each of the M optical outputs N times such that N×M second optical input signals are produced.

24. A hybrid optical/electronic cross connection apparatus for implementing digital logic functions, the apparatus comprising:

first emitter means for converting a first plurality of electrical input bits to a greater number of first optical input signals;

second emitter means for converting a second plurality of input bits to a greater number of second optical input signals;

third emitter means for converting a third plurality of electrical input bits to a greater number of third optical input signals; and a cross connection array including (1) a plurality of detector means for detecting first, second and third optical input signals, (2) means for electrically performing digital logic operations within the cross connection array using selected ones of the detected optical input signals to produce electrical output signals, and (3) a plurality of means for producing optical output signals from the electrical output signals;

a plurality of second detector means each being for detecting at least one of the optical output signals from the cross connection array;

a plurality of first optical fiber interconnects for carrying the optical input signals from the first and second emitter means to the detector means of the cross connection array; and a plurality of second optical fiber interconnects for carrying the optical input signals from the third emitter means to the second detector means.

25. A cross connection apparatus as in claim 24, wherein the optical signals from the first and second emitter means being arranged orthogonally to the optical signals from the third emitter means.

26. A hybrid optical/electronic cross connection apparatus for implementing digital logic functions, the apparatus comprising:

first emitter means for converting a first plurality of electrical input bits to a greater number of first optical input signals;

a cross connection array including (1) a plurality of detector means for detecting the first optical input signals, (2) means-for electrically performing digital logic operations within the cross connection array using at least selected ones of the detected optical input signals to produce electrical output signals, and (3) a plurality of optical emitter means for producing optical output signals from electrical output signals;

a plurality of second detector means spaced apart from the optical emitter means, each such second detector means being for detecting at least one of the optical output signals from the optical emitter means of the array;

a plurality of third detector means spaced apart from the optical emitter means in a location distinct from that of the second detector means, each such third detector means being for detecting at least one of the optical output signals from the array;

a plurality of first optical fiber interconnects for carrying the optical input signals from the first emitter means to the detector means of the cross connection array; and a plurality of second optical fiber interconnects for carrying the optical input signals from the second emitter means to the plurality of second detector means; and a plurality of third optical fiber interconnects for carrying the optical input signals from the second emitter means to the plurality of third detector means.

27. A cross connection apparatus as in claim 26, further comprising:

a plurality of fourth detector means spaced apart from the optical emitter means in a location distinct from that of the second and third detector means, each such fourth detector means being for detecting at least one of the optical output signals from the array; and a plurality of fourth optical fiber interconnects for carrying the optical input signals from the second emitter means to the plurality of fourth detector means.

28. A hybrid optical/electronic cross connection apparatus, comprising:

a plurality of means for producing a plurality of distinct optical input signals;

a cross connection array including (1) a plurality of first detector means each being for detecting optical input signals, (2) means for electrically performing digital logic operations within the cross connection array, and (3) a plurality of means for producing optical output signals from electrical output signals;

a plurality of means for detecting the optical output signals;

a first plurality of fiber optic interconnects between the plurality of means for producing optical input signals and the plurality of first detector means, said first plurality of fiber optic interconnects being arranged to implement at least one optical fan-out factor which exceeds unity; and a second plurality of fiber optic interconnects between the plurality of means for providing optical output signals and the plurality of means for detecting the optical output signals, and wherein at least one of the first and second pluralities of fiber optic interconnects includes less than a global set of interconnections.

29. A cross connection apparatus as in claim 28, wherein: the first plurality of fiber optic interconnects is less than a global set of interconnections and constitutes a master input subset of input interconnections.

30. A cross connection apparatus as in claim 29, wherein the master input subset is determined by:
(1) analyzing an intended application where the cross connection apparatus is to be used to determine each different working set of input interconnections that may need to exist at any given instant of time when the apparatus is operating;
(2) identifying those interconnections common to two or more of such working sets; and
(3) selecting the master input subset by including within the master input subset all of the interconnects required to implement each of the working sets of input interconnections with duplicate interconnects being eliminated.

31. A cross connection apparatus as in claim 28, wherein:
the second plurality of fiber optic interconnects is less than a global set of interconnections and constitutes a master output subset of output interconnections.

32. A cross connection apparatus as in claim 31, wherein the master output subset is determined by:
(1) analyzing an intended application where the cross connection apparatus is to be used to determine each different working set of output interconnections that may need to exist at any given instant of time when the apparatus is operating;
(2) identifying those interconnections common to two or more of such working sets; and
(3) selecting the master output subset by including within the master output subset all of the interconnects required to implement each of the working sets of output interconnections with duplicate interconnects being eliminated.

* * * * *